(12) United States Patent
Lee et al.

(10) Patent No.: US 9,306,603 B2
(45) Date of Patent: Apr. 5, 2016

(54) TUNABLE RADIO FREQUENCY (RF) FRONT-END ARCHITECTURE USING FILTER HAVING ADJUSTABLE INDUCTANCE AND CAPACITANCE

(71) Applicant: QUALCOMM Incorporated, San Diego, CA (US)

(72) Inventors: Hong-Ming Lee, San Diego, CA (US); Kevin Hsi-huai Wang, San Diego, CA (US); Himanshu Khatri, Laguna Niguel, CA (US); Meng Li, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 35 days.

(21) Appl. No.: 14/297,954

(22) Filed: Jun. 6, 2014

(65) Prior Publication Data
US 2015/0214985 A1    Jul. 30, 2015

Related U.S. Application Data

(60) Provisional application No. 61/930,975, filed on Jan. 24, 2014.

(51) Int. Cl.
| H04B 1/00 | (2006.01) |
| H04B 1/10 | (2006.01) |
| H03H 7/01 | (2006.01) |

(52) U.S. Cl.
CPC ........... *H04B 1/0053* (2013.01); *H03H 7/0115* (2013.01); *H03H 7/1758* (2013.01);
(Continued)

(58) Field of Classification Search
CPC ............. H04B 1/40; H04B 1/406; H04B 1/44
USPC ............. 455/77, 526, 120, 125, 150.1, 169.1, 455/173.1, 178.1, 191.1; 331/175; 327/392
See application file for complete search history.

(56) References Cited

U.S. PATENT DOCUMENTS

| 2,496,177 | A | 1/1950 | Richards et al. |
| 3,693,117 | A * | 9/1972 | Byrns ................ H03H 7/0161 333/81 R |

(Continued)

FOREIGN PATENT DOCUMENTS

| EP | 1605589 A1 | 12/2005 |
| EP | 1605589 A4 | 3/2007 |

(Continued)

OTHER PUBLICATIONS

Choi D-H., et al., "Linearly Variable Inductor with RF MEMS Switches to enlarge a Continuous Tuning Range", Solid-State Sensors, Actuators, and Microsystems Conference, 2009.Transducers, 2009.International, IEEE, Piscataway, NJ, USA, Jun. 21, 2009, pp. 573-576, XP031545307, ISBN: 978-1-4244-4190-7.

(Continued)

*Primary Examiner* — Alejandro Rivero
(74) *Attorney, Agent, or Firm* — Smith Risley Tempel Santos LLC

(57) ABSTRACT

A device includes an adjustable capacitance and a switchable inductance coupled to the adjustable capacitance and configured as a tunable resonant circuit, the switchable inductance comprising a tapped structure having a first inductance and a second inductance.

18 Claims, 14 Drawing Sheets

(52) U.S. Cl.
CPC ........... *H03H7/1766* (2013.01); *H03H 7/1775* (2013.01); *H04B 1/1036* (2013.01); *H03H 2210/012* (2013.01); *H03H 2210/015* (2013.01); *H03H 2210/025* (2013.01); *H03H 2210/026* (2013.01); *H04B 2001/1063* (2013.01); *H04B 2001/1072* (2013.01)

(56) References Cited

U.S. PATENT DOCUMENTS

| | | | | |
|---|---|---|---|---|
| 3,863,170 | A * | 1/1975 | Ratcliff | H03F 3/2176 327/170 |
| 4,586,007 | A * | 4/1986 | Ciszek | H03H 7/1791 333/174 |
| 5,262,730 | A * | 11/1993 | Smith | G01R 27/2623 324/650 |
| 5,561,399 | A | 10/1996 | Haartsen | |
| 6,009,318 | A * | 12/1999 | Freed | H03H 7/42 455/323 |
| 7,292,113 | B2 | 11/2007 | Rohde et al. | |
| 7,295,076 | B2 | 11/2007 | Kim et al. | |
| 7,460,001 | B2 | 12/2008 | Jessie | |
| 7,999,608 | B1 | 8/2011 | Groe et al. | |
| 8,098,114 | B2 | 1/2012 | Fukuda et al. | |
| 8,314,653 | B1 | 11/2012 | Granger-Jones et al. | |
| 8,493,126 | B2 | 7/2013 | Sankaranarayanan et al. | |
| 8,502,614 | B2 | 8/2013 | Nakamura et al. | |
| 8,773,211 | B2 * | 7/2014 | Roithmeier | H03B 5/1284 331/117 FE |
| 2002/0151287 | A1 | 10/2002 | Lindquist et al. | |
| 2003/0227354 | A1 | 12/2003 | Utsunomiya et al. | |
| 2004/0224649 | A1 | 11/2004 | Shamsaifar | |
| 2005/0184828 | A1 | 8/2005 | Son et al. | |
| 2007/0140391 | A1 | 6/2007 | Pan | |
| 2010/0156562 | A1 | 6/2010 | Kim | |
| 2012/0169565 | A1 | 7/2012 | Morris, III | |
| 2012/0208473 | A1 | 8/2012 | Aparin | |
| 2012/0256677 | A1 * | 10/2012 | Rehm | H04N 3/16 327/392 |
| 2012/0295553 | A1 | 11/2012 | Sahota | |
| 2012/0302188 | A1 | 11/2012 | Sahota et al. | |
| 2013/0062967 | A1 * | 3/2013 | Teggatz | H02J 5/005 307/104 |
| 2013/0222075 | A1 | 8/2013 | Reedy et al. | |
| 2013/0244591 | A1 | 9/2013 | Weissman et al. | |
| 2014/0028108 | A1 * | 1/2014 | Hsu | H01F 38/14 307/104 |
| 2014/0073271 | A1 * | 3/2014 | Ilkov | H03F 3/187 455/91 |
| 2015/0054561 | A1 * | 2/2015 | Shivaram | H01L 21/8234 327/311 |

FOREIGN PATENT DOCUMENTS

| | | |
|---|---|---|
| EP | 1887705 A2 | 2/2008 |
| EP | 1916735 A1 | 4/2008 |
| JP | H09307459 A | 11/1997 |
| WO | 9639727 A1 | 12/1996 |
| WO | 2013040272 | 3/2013 |

OTHER PUBLICATIONS

International Search Report and Written Opinion—PCT/US2015/012384—ISA/EPO—Apr. 1, 2015.

Pham K. D., et al., "On-Chip Variable Inductor Using MOSFET Switches", 2005 European Microwave Conference CNIT La Defense, Paris, France Oct. 4-6, 2005, Piscataway, NJ, USA, IEEE, vol. 2, Oct. 4, 2005, pp. 1347-1350, XP010904023, DOI: 10.1109/EUMC.2005.1610185, ISBN: 978-2-9600551-2-2.

Aliouane S., et al., "RF-MEMS Switchable Inductors for Tunable Bandwidth BAW Filters", International Conference on Design & Technology of Integrated Systems in Nanoscale Era, 2010, 6 Pages.

Chiou Y., et al., "Tunable 1.55-2.1 GHz 4-Pole Elliptic Bandpass Filter with Bandwidth Control and > 50 dB Rejection for Wireless Systems", IEEE Transactions on Microwave Theory and Techniques, Jan. 2013, vol. 61 (1), pp. 117-124.

Cho Y.H., et al., "0.73-1.03-GHz Tunable Bandpass Filter With a Reconfigurable 2/3/4-Pole Response", IEEE Transactions on Microwave Theory and Techniques, Feb. 2014, vol. 62 (2), pp. 290-296.

Darvishi M., et al., "A 0.1-to-1.2GHz Tunable 6th-Order N-Path Channel-Select Filter with 0.6dB Passband Ripple and +7dBm Blocker Tolerance", IEEE International Solid-State Circuits Conference, ISSCC 2013/SESSION10/ Analog Techniques / 10.1,Feb. 19, 2013, pp. 172-174.

Darvishi M., et al., "Design of Active N-Path Filters", IEEE Journal of Solid-State Circuits, Dec. 2013, vol. 48 (12), pp. 2962-2976.

International Search Report and Written Opinion—PCT/US2012/055251—ISA/EPO—May 24, 2013.

Ko CH., et al., "A 1.5-2.4 GHz Tunable 4-Pole Filter Using Commercial High-Reliability 5-Bit RF MEMS Capacitors", IEEE, 2013, 4 pages.

Lee H-M., et al., "A 640-1030 MHz Four-Pole Tunable Filter with Improved Stopband Rejection and Controllable Bandwidth and Transmission Zeros", IEEE, 2013, 3 Pages.

Nieuwoudt A., et al., "Optimizing the Design of Tunable Spiral Inductors for On-Chip Wireless Applications", WAMICON, 2006, 5 Pages.

Park P., et al., "Variable Inductance Multilayer Inductor with MOSFET Switch Control", IEEE Electron Device Letters, Mar. 2004, vol. 25 (3), pp. 144-146.

Rais-Zadeh M., et al., "MEMS Switched Tunable Inductors", Journal of Microelectromechanical Systems, Feb. 2008, vol. 17 (1), pp. 78-84.

U.S. Appl. No. 61/524,250, filed Aug. 16, 2011.

* cited by examiner

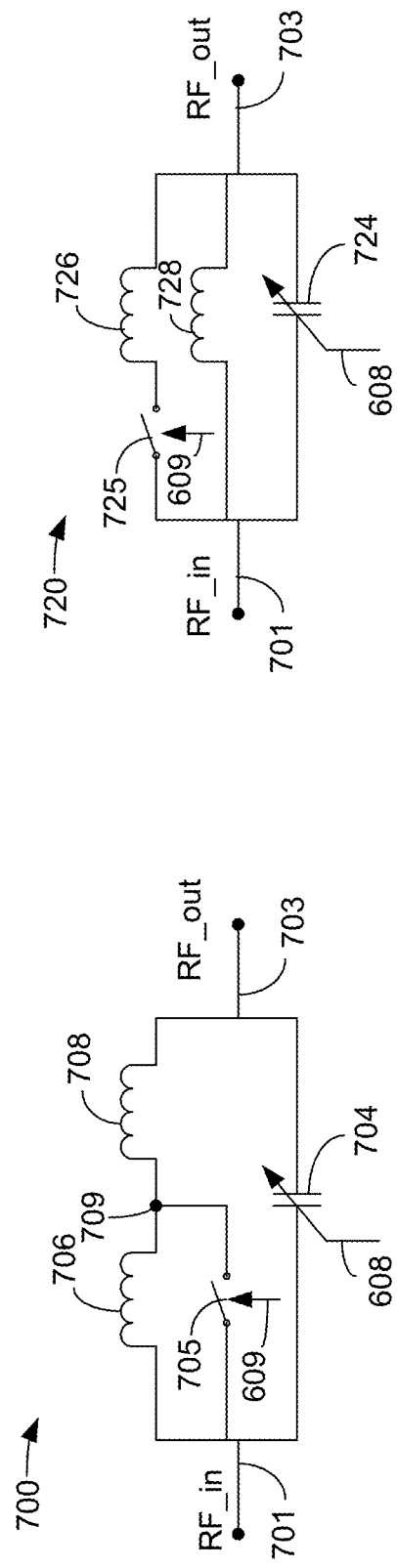

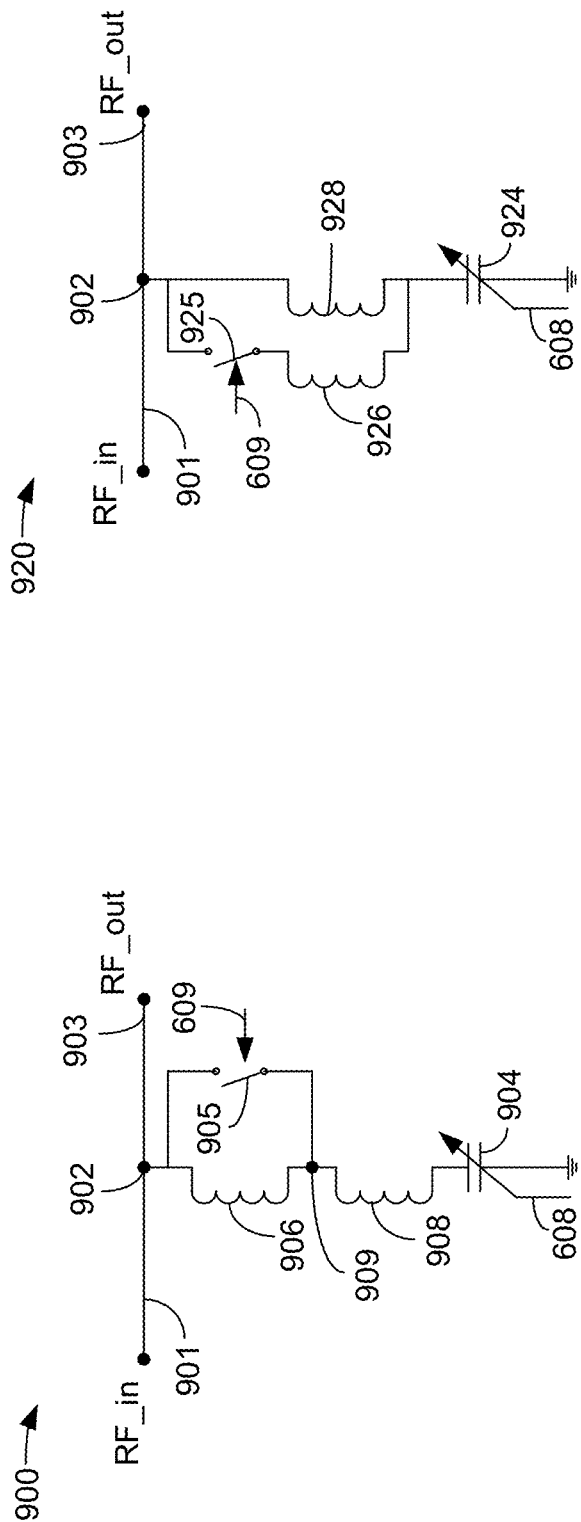

TUNABLE RADIO FREQUENCY (RF) FRONT-END ARCHITECTURE USING FILTER HAVING ADJUSTABLE INDUCTANCE AND CAPACITANCE

RELATED APPLICATION

The present application claims priority to and the benefit of the filing date of U.S. Provisional Application No. 61/930,975, entitled "Tunable Radio Frequency (RF) Front-End Architecture" filed on Jan. 24, 2014, the entirety of which is incorporated into this document by reference.

BACKGROUND

1. Field

The present disclosure relates generally to electronics, and more specifically to transmitters and receivers.

2. Background

In a radio frequency (RF) transceiver, a communication signal is typically received and downconverted by receive circuitry, sometimes referred to as a receive chain. A receive chain typically includes a receive filter, a low noise amplifier (LNA), a mixer, a local oscillator (LO), a voltage controlled oscillator (VCO), a baseband filter, and other components, to recover the information contained in the communication signal. The transceiver also includes circuitry that enables the transmission of a communication signal to a receiver in another transceiver. The transceiver may be able to operate over multiple frequency ranges, typically referred to a frequency bands. Moreover, a single transceiver may be configured to operate using multiple carrier signals that may occur in the same frequency band, but that may not overlap in actual frequency, an arrangement referred to as non-contiguous carriers.

In some instances, it is desirable to have a single transmitter or receiver that is configured to operate using multiple transmit frequencies and/or multiple receive frequencies. For a receiver to be able to simultaneously receive two or more receive signals, the concurrent operation of two or more receive paths is generally required. Such systems are sometimes referred to as "carrier-aggregation" systems. The term "carrier-aggregation" may refer to systems that include inter-band carrier aggregation and intra-band carrier aggregation. Intra-band carrier aggregation refers to the processing of two separate carrier signals that occur in the same communication band. Inter-band carrier aggregation refers to the processing of two separate carrier signals that occur in different communication bands.

One of the challenges in receiving multiple signals in a receiver is preventing out of band (OOB) signals, referred to as "jammers" or "blockers" from interfering with the desired receive signals. Examples of OOB blockers include, for example, transmit energy from a nearby transmitter that can interfere with the receive signal due to the proximity of the transmit antenna to one or more receive antennas, and other blockers, such as wireless fidelity (WiFi) signals. One way of preventing OOB blockers from interfering with the desired receive signals is to implement a surface acoustic wave (SAW) filter. A SAW filter provides effective blocker rejection and a low insertion loss, but generally must be fabricated as a discrete component, and is not tunable. Accordingly, in a multi-band receiver the front-end is typically implemented using a number of band-select switches to direct the receive signal to the appropriate SAW filter. The SAW filter is then typically connected to a dedicated low noise amplifier (LNA). Typically, a matching network is also required between the SAW filter and the LNA to obtain good impedance matching.

Existing tunable filters sometimes use tunable or adjustable capacitances, sometimes implemented using a digital variable capacitance (DVC). Unfortunately, adjusting filter characteristics using an adjustable capacitance tends to lower the quality factor (Q factor) of the filter.

Therefore, it would be desirable to be able to process multiple receive signals in multiple receive bands using a tunable filter that can be reconfigured to the desired band and that maintains a high Q factor, thus eliminating the need for a SAW filter and matching network for each receive band.

BRIEF DESCRIPTION OF THE DRAWINGS

In the figures, like reference numerals refer to like parts throughout the various views unless otherwise indicated. For reference numerals with letter character designations such as "102a" or "102b", the letter character designations may differentiate two like parts or elements present in the same figure. Letter character designations for reference numerals may be omitted when it is intended that a reference numeral may encompass all parts having the same reference numeral in all figures.

FIG. 7A is a schematic diagram illustrating a first exemplary embodiment of a tunable notch resonator circuit.

FIG. 7B is a schematic diagram illustrating a second exemplary embodiment of a tunable notch resonator circuit.

FIG. 9A is a schematic diagram illustrating a first exemplary embodiment of a tunable trap resonator circuit.

FIG. 9B is a schematic diagram illustrating a second exemplary embodiment of a tunable trap resonator circuit.

DETAILED DESCRIPTION

The word "exemplary" is used herein to mean "serving as an example, instance, or illustration." Any aspect described herein as "exemplary" is not necessarily to be construed as preferred or advantageous over other aspects.

In this description, the term "application" may also include files having executable content, such as: object code, scripts, byte code, markup language files, and patches. In addition, an "application" referred to herein, may also include files that are not executable in nature, such as documents that may need to be opened or other data files that need to be accessed.

The term "content" may also include files having executable content, such as: object code, scripts, byte code, markup language files, and patches. In addition, "content" referred to herein, may also include files that are not executable in nature, such as documents that may need to be opened or other data files that need to be accessed.

In an exemplary embodiment, the tunable radio frequency (RF) front-end architecture relates to an architecture for implementing a tunable RF front-end that provides band selection, unwanted signal rejection, and low insertion loss without using a surface acoustic wave (SAW) filter and matching circuitry for each receive band.

Exemplary embodiments of the disclosure are directed toward a tunable radio frequency (RF) front-end architecture that includes a tunable filter, followed by a low noise amplifier (LNA), followed by another tunable filter. Exemplary embodiments of the disclosure can be implemented in a time domain duplex (TDD) or diversity receiver. Exemplary embodiments of the disclosure can also be implemented in half-duplex frequency domain duplex (FDD) system, where although transmit and receive systems use different frequencies, such as with an FDD system, only the transmit or receive function is enabled at any instant, such as in a TDD system.

Figure 1:
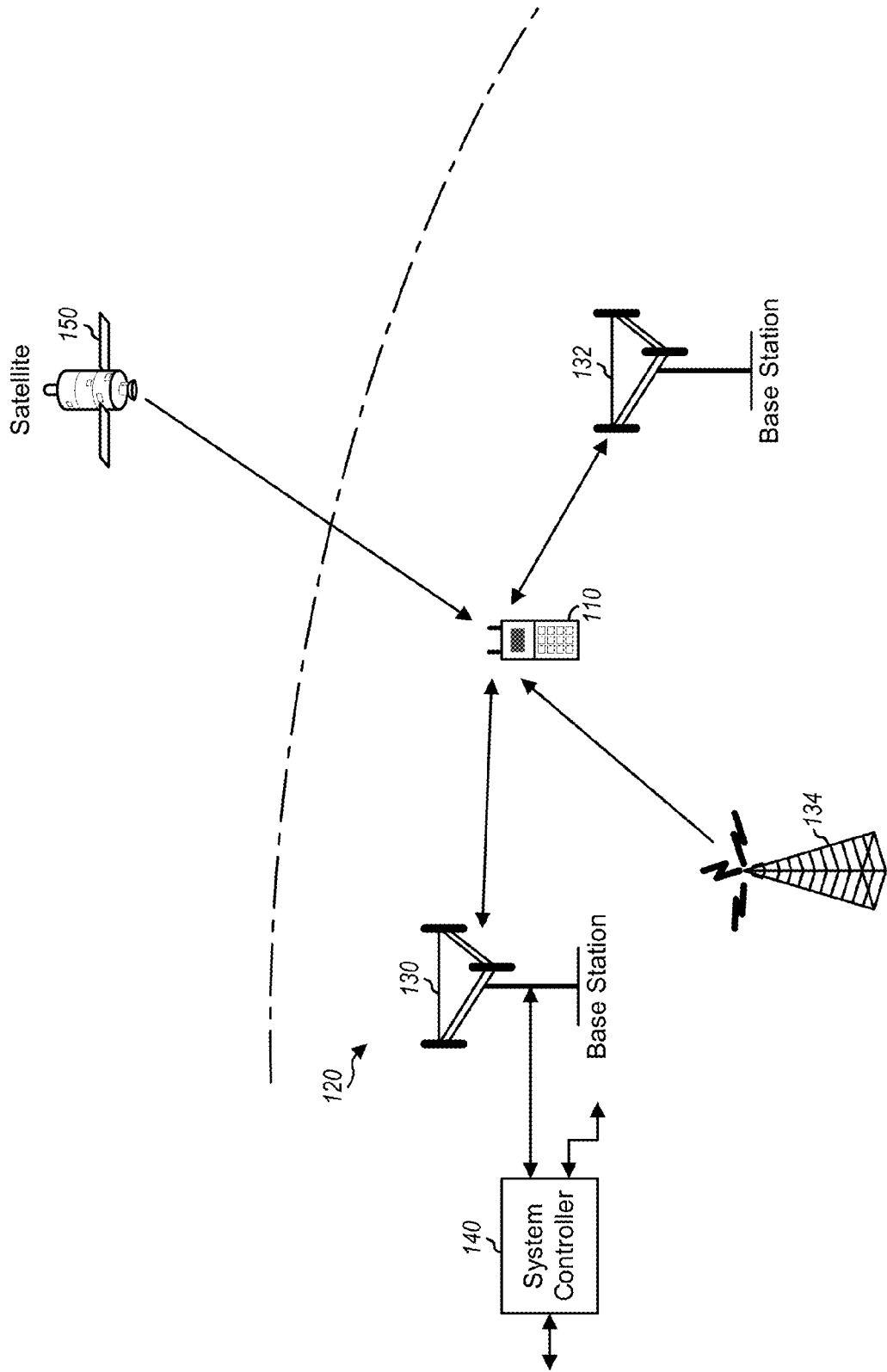
FIG. 1 is a diagram showing a wireless device communicating with a wireless communication system.

FIG. 1 is a diagram showing a wireless device 110 communicating with a wireless communication system 120. The wireless communication system 120 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1×, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless communication system may include any number of base stations and any set of network entities.

The wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a tablet, a cordless phone, a wireless local loop (WLL) station, a Bluetooth device, etc. Wireless device 110 may communicate with wireless communication system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, WCDMA, CDMA 1×, EVDO, TD-SCDMA, GSM, 802.11, etc.

Wireless device 110 may support carrier aggregation, which is operation on multiple carriers. Carrier aggregation may also be referred to as multi-carrier operation. Wireless device 110 may be able to operate in low-band (LB) covering frequencies lower than 1000 megahertz (MHz), mid-band (MB) covering frequencies from 1000 MHz to 2300 MHz, and/or high-band (HB) covering frequencies higher than 2300 MHz. For example, low-band may cover 698 to 960 MHz, mid-band may cover 1475 to 2170 MHz, and high-band may cover 2300 to 2690 MHz and 3400 to 3800 MHz. Low-band, mid-band, and high-band refer to three groups of bands (or band groups), with each band group including a number of frequency bands (or simply, "bands"). Each band may cover up to 200 MHz and may include one or more carriers. Each carrier may cover up to 20 MHz in LTE. LTE Release 11 supports 35 bands, which are referred to as LTE/UMTS bands and are listed in 3GPP TS 36.101. Wireless device 110 may be configured with up to five carriers in one or two bands in LTE Release 11.

In general, carrier aggregation (CA) may be categorized into two types—intra-band CA and inter-band CA. Intra-band CA refers to operation on multiple carriers within the same band. Inter-band CA refers to operation on multiple carriers in different bands.

Figures 2A, 2B, 2C, 2D:
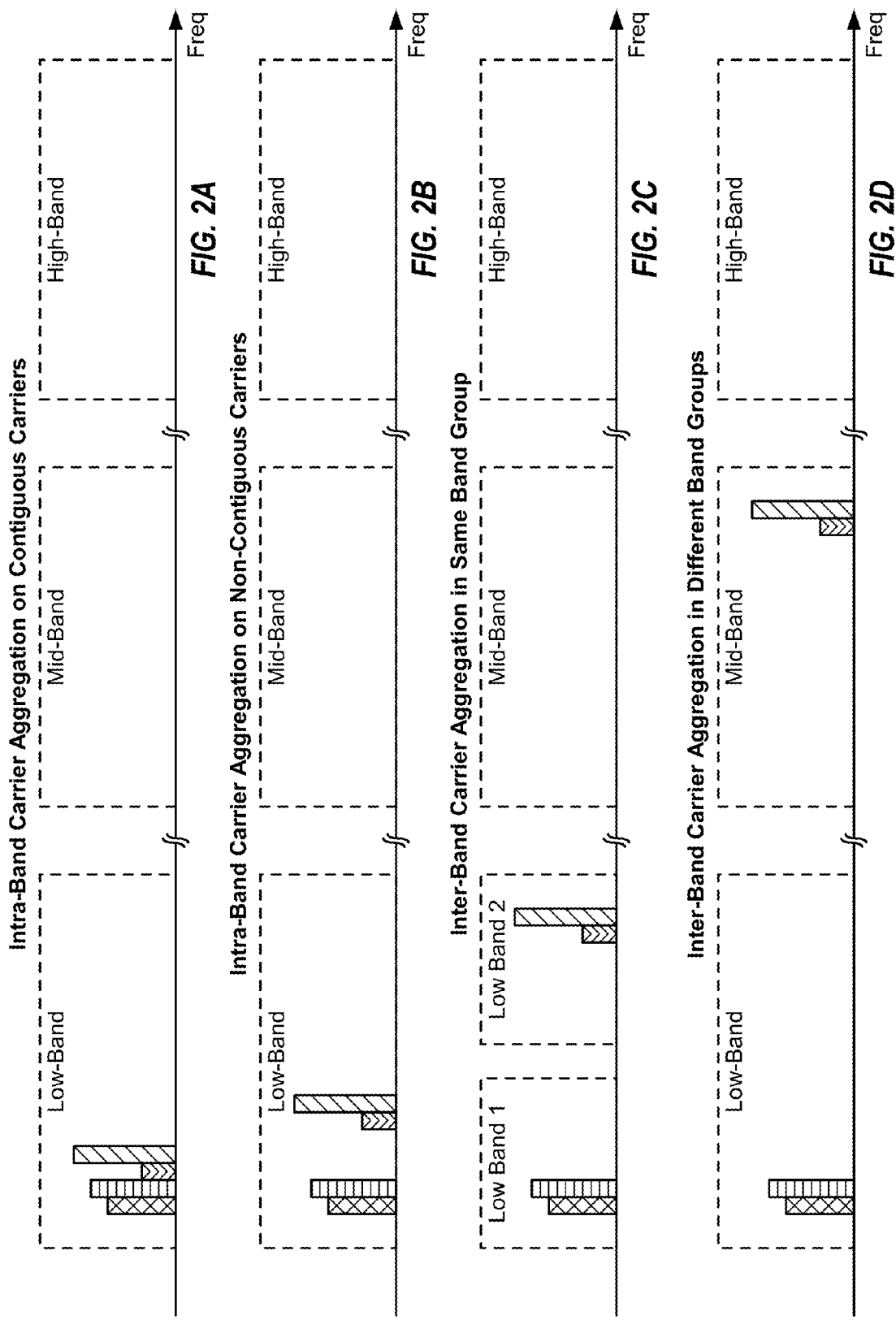
FIG. 2A is a graphical diagram showing an example of contiguous intra-band carrier-aggregation (CA).
FIG. 2B is a graphical diagram showing an example of non-contiguous intra-band CA.
FIG. 2C is a graphical diagram showing an example of inter-band CA in the same band group.
FIG. 2D is a graphical diagram showing an example of inter-band CA in different band groups.

FIG. 2A is a graphical diagram showing an example of contiguous intra-band carrier-aggregation (CA). In the example shown in FIG. 2A, wireless device 110 is configured with four contiguous carriers in one band in low-band. Wireless device 110 may send and/or receive transmissions on the four contiguous carriers within the same band.

FIG. 2B is a graphical diagram showing an example of non-contiguous intra-band CA. In the example shown in FIG. 2B, wireless device 110 is configured with four non-contiguous carriers in one band in low-band. The carriers may be separated by 5 MHz, 10 MHz, or some other amount. Wireless device 110 may send and/or receive transmissions on the four non-contiguous carriers within the same band.

FIG. 2C is a graphical diagram showing an example of inter-band CA in the same band group. In the example shown in FIG. 2C, wireless device 110 is configured with four carriers in two bands in low-band. Wireless device 110 may send and/or receive transmissions on the four carriers in different bands in the same band group.

FIG. 2D is a graphical diagram showing an example of inter-band CA in different band groups. In the example shown in FIG. 2D, wireless device 110 is configured with four carriers in two bands in different band groups, which include two carriers in one band in low-band and two carriers in another band in mid-band. Wireless device 110 may send and/or receive transmissions on the four carriers in different bands in different band groups.

FIGS. 2A to 2D show four examples of carrier aggregation. Carrier aggregation may also be supported for other combinations of bands and band groups.

Figure 3:
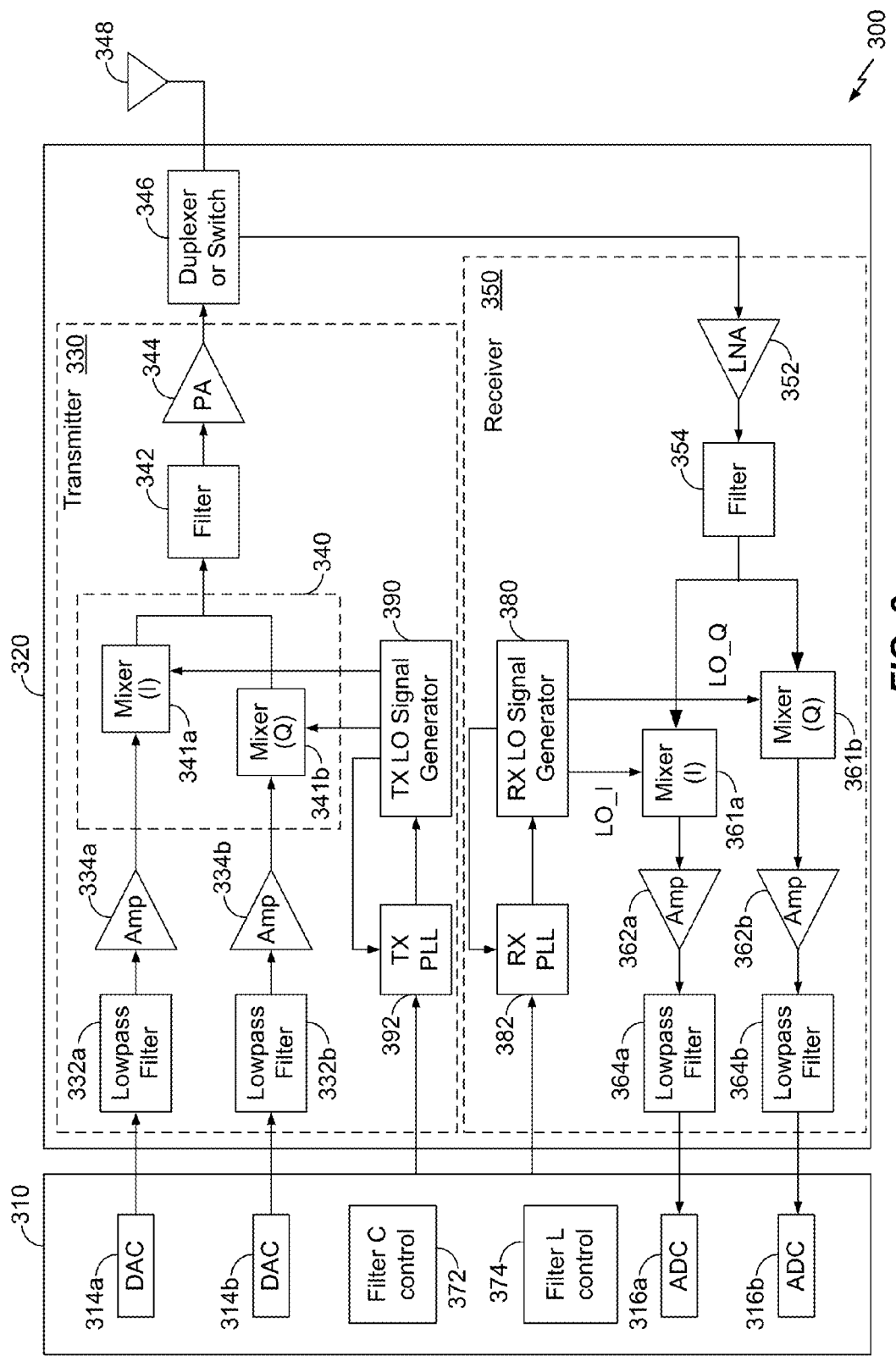
FIG. 3 is a block diagram showing a wireless device in which the exemplary techniques of the present disclosure may be implemented.

FIG. 3 is a block diagram showing a wireless device 300 in which the exemplary techniques of the present disclosure may be implemented. FIG. 3 shows an example of a transceiver 320. In general, the conditioning of the signals in a transmitter 330 and a receiver 350 may be performed by one or more stages of amplifier, filter, upconverter, downconverter, etc. These circuit blocks may be arranged differently from the configuration shown in FIG. 3. Furthermore, other circuit blocks not shown in FIG. 3 may also be used to condition the signals in the transmitter 330 and receiver 350. Unless otherwise noted, any signal in FIG. 3, or any other figure in the drawings, may be either single-ended or differential. Some circuit blocks in FIG. 3 may also be omitted.

In the example shown in FIG. 3, wireless device 300 generally comprises a transceiver 320 and a data processor 310. The data processor 310 may include a memory (not shown) to store data and program codes, and may generally comprise analog and digital processing elements. The transceiver 320 includes a transmitter 330 and a receiver 350 that support bi-directional communication. In general, wireless device 300 may include any number of transmitters and/or receivers for any number of communication systems and frequency bands. All or a portion of the transceiver 320 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency-converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the example shown in FIG. 3, transmitter 330 and receiver 350 are implemented with the direct-conversion architecture.

In the transmit path, the data processor 310 processes data to be transmitted and provides in-phase (I) and quadrature (Q) analog output signals to the transmitter 330. In an exemplary embodiment, the data processor 310 includes digital-to-analog-converters (DAC's) 314a and 314b for converting digital signals generated by the data processor 310 into the I and Q analog output signals, e.g., I and Q output currents, for further processing.

Within the transmitter 330, lowpass filters 332a and 332b filter the I and Q analog transmit signals, respectively, to remove undesired images caused by the prior digital-to-analog conversion. Amplifiers (Amp) 334a and 334b amplify the signals from lowpass filters 332a and 332b, respectively, and provide I and Q baseband signals. An upconverter 340 upconverts the I and Q baseband signals with I and Q transmit (TX) local oscillator (LO) signals from a TX LO signal generator 390 and provides an upconverted signal. A filter 342 filters the upconverted signal to remove undesired images caused by the frequency upconversion as well as noise in a receive frequency band. A power amplifier (PA) 344 amplifies the signal from filter 342 to obtain the desired output power level and provides a transmit RF signal. The transmit RF signal is routed through a duplexer or switch 346 and transmitted via an antenna 348.

In the receive path, antenna 348 receives communication signals and provides a received RF signal, which is routed through duplexer or switch 346 and provided to a low noise amplifier (LNA) 352. The LNA 352 may comprise a single LNA configured to operate on one or more carrier signals, either stand-alone or simultaneously, or may comprise two or more LNAs configured to operate on one or more carrier signals, either stand-alone or simultaneously. The duplexer 346 is designed to operate with a specific RX-to-TX duplexer frequency separation, such that RX signals are isolated from TX signals. The received RF signal is amplified by LNA 352 and filtered by a filter 354 to obtain a desired RF input signal. Downconversion mixers 361a and 361b mix the output of filter 354 with I and Q receive (RX) LO signals (i.e., LO_I and LO_Q) from an RX LO signal generator 380 to generate I and Q baseband signals. The I and Q baseband signals are amplified by amplifiers 362a and 362b and further filtered by lowpass filters 364a and 364b to obtain I and Q analog input signals, which are provided to data processor 310. In the exemplary embodiment shown, the data processor 310 includes analog-to-digital-converters (ADC's) 316a and 316b for converting the analog input signals into digital signals to be further processed by the data processor 310.

In FIG. 3, TX LO signal generator 390 generates the I and Q TX LO signals used for frequency upconversion, while RX LO signal generator 380 generates the I and Q RX LO signals used for frequency downconversion. Each LO signal is a periodic signal with a particular fundamental frequency. A phase locked loop (PLL) 392 receives timing information from data processor 310 and generates a control signal used to adjust the frequency and/or phase of the TX LO signals from LO signal generator 390. Similarly, a PLL 382 receives timing information from data processor 310 and generates a control signal used to adjust the frequency and/or phase of the RX LO signals from LO signal generator 380.

In an exemplary embodiment, the data processor 310 comprises a filter capacitance (C) control circuit 372 and a filter inductance (L) control circuit 374. The filter capacitance (C) control circuit 372 generates a first control signal that is used to adjust the capacitance of the filter 354. In an exemplary embodiment, the filter inductance (L) control circuit 374 generates a second control signal that is used to adjust the capacitance of the filter 354.

Wireless device 300 may support CA and may (i) receive multiple downlink signals transmitted by one or more cells on multiple downlink carriers at different frequencies and/or (ii) transmit multiple uplink signals to one or more cells on multiple uplink carriers.

Figure 4:
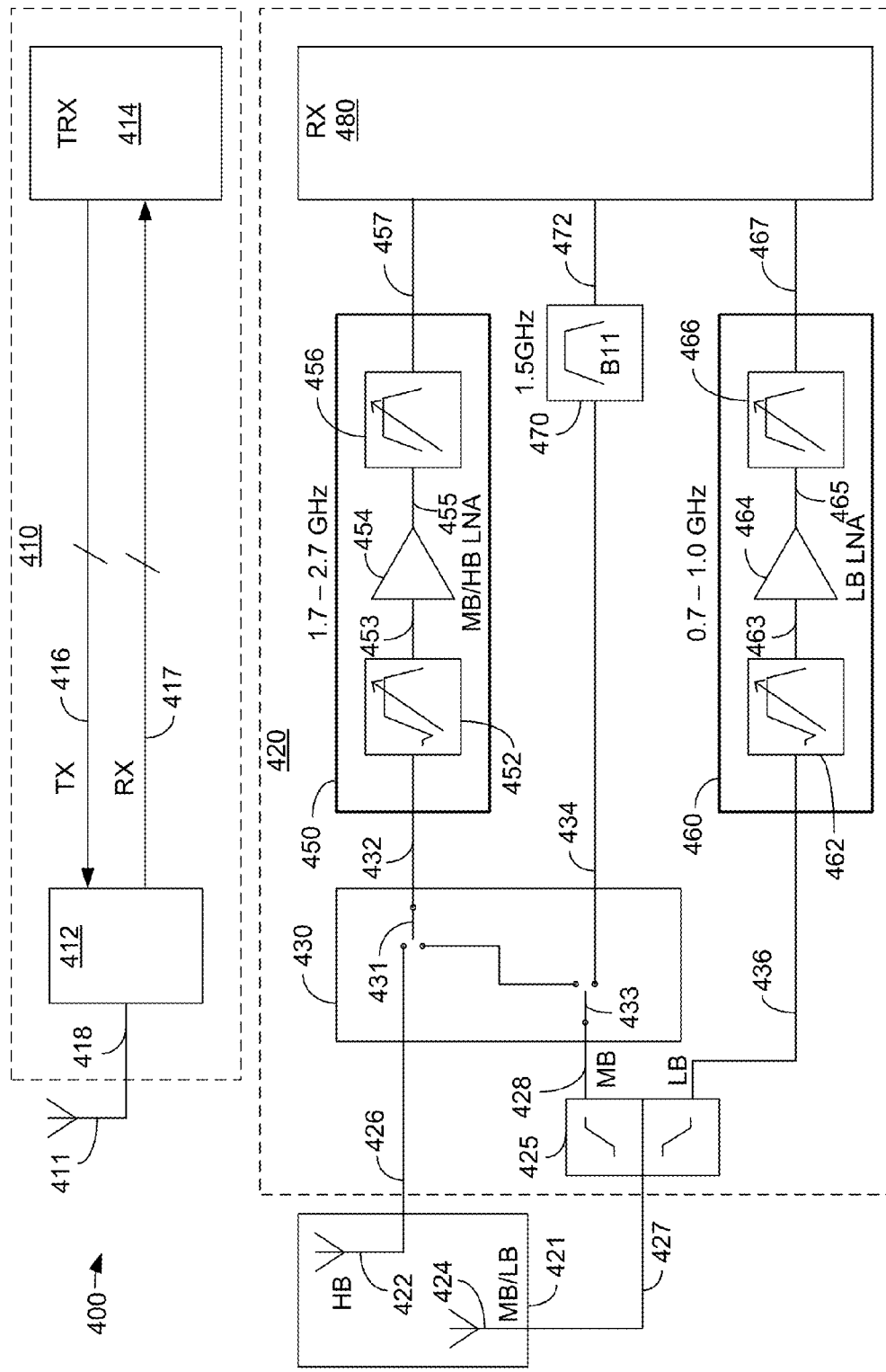
FIG. 4 is a schematic diagram illustrating an exemplary embodiment of a system having a tunable radio frequency (RF) front-end architecture.

FIG. 4 is a schematic diagram illustrating an exemplary embodiment of a system 400 having a tunable radio frequency (RF) architecture. The system 400 comprises a primary transceiver system 410 having a primary antenna 411, a duplexer 412 and a transceiver 414. The duplexer 412 is coupled to the transceiver 414 over transmit coupling 416 and receive coupling 417, each of which comprise multiple connections. The duplexer allows bi-directional (duplex) communication of transmit and receive signals over a single path 418 by isolating the transmit and receive signals.

The system 400 also comprises a secondary receiver system 420. In an exemplary embodiment, the secondary receiver system 420 comprises a diversity receiver comprising a dual feed antenna 421 (also referred to as a diversity antenna) a diplexer 425, a switch network 430, a first tunable RF front-end module 450, a second tunable RF front-end module 460, a filter 470 and a receiver 480. In an exemplary embodiment, the receiver 480 comprises downconversion, amplification, filtering and other circuitry.

In an exemplary embodiment, the dual feed antenna 421 comprises a first antenna 422 and a second antenna 424. In an exemplary embodiment, the first antenna 422 can be configured to process a radio frequency (RF) signal in what is referred to as a "high band" (HB). In an exemplary embodiment, the second antenna 424 can be configured to process a radio frequency (RF) signal in what is referred to as a "mid band" (MB) and "low band" (LB). More than two antennas can be implemented in a diversity antenna system, with two antennas being illustrated for simplicity.

The first antenna 422 is coupled to the switch network 430 over connection 426 and the second antenna 424 is coupled to the diplexer 425 over connection 427. The switch network 430 comprises a first switch 431 and a second switch 433. The first antenna 422 provides a high-band RF signal over connection 426 to the first switch 431. The diplexer 425 is connected to the second switch 433 over connection 428. The diplexer 425 is connected to the second tunable RF front-end module 460 over connection 436. The diplexer provides a mid-band RF signal to the switch 433 over connection 428 and provides a low band RF signal to the second tunable RF front-end module 460 over connection 436.

In an exemplary embodiment, in a first position, the first switch 431 can be configured to deliver the high-band RF signal to the first tunable RF front-end module 450 over connection 432.

In an exemplary embodiment, the first switch 431 and the second switch 433 can be configured to deliver the mid-band RF signal from the diplexer 425 to the first tunable RF front-end module 450; and can also be configured to deliver the mid-band RF signal from the diplexer 425 to the filter 470 over connection 434. In an exemplary embodiment, the filter 470 can be configured to pass an RF signal in the 1.5 GHz frequency band over connection 472 to the receiver 480. The switches 431 and 433 can be controlled by control logic (not shown) associated with the receiver 480.

The first tunable RF front-end module 450 comprises a first tunable filter 452 coupled to a low noise amplifier (LNA) 454 over connection 453. The LNA 454 is coupled to a second tunable filter 456 over connection 455. The output of the second tunable filter 456 is provided to the receiver 480 over connection 457. The second tunable RF front-end module 460 comprises a first tunable filter 462 coupled to a low noise amplifier (LNA) 464 over connection 463. The LNA 464 is coupled to a second tunable filter 466 over connection 465. The output of the second tunable filter 466 is provided to the receiver 480 over connection 467.

In an exemplary embodiment, the first tunable RF front-end module 450 can be configured to process an RF signal in the high-band and in the mid-band, comprising a frequency range of approximately 1.7-2.7 GHz. In an exemplary embodiment, the second tunable RF front-end module 460 can be configured to process an RF signal in the low-band comprising a frequency range of approximately 0.7-1.0 GHz.

Figure 5:
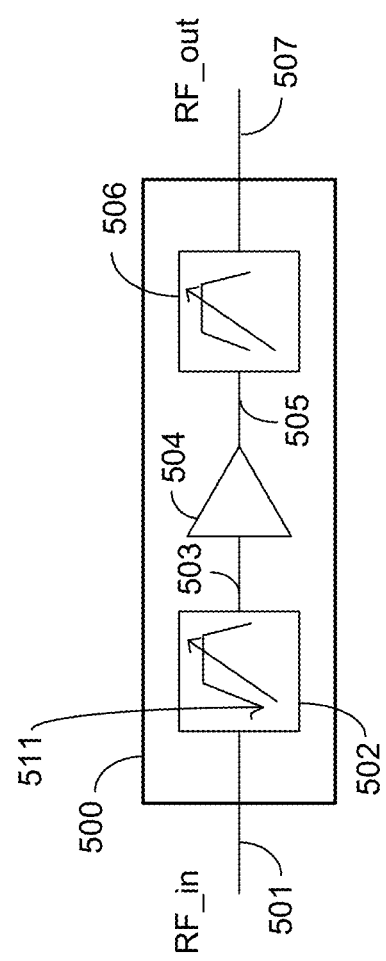
FIG. 5 is a schematic diagram illustrating an exemplary embodiment of a tunable RF front-end module.

FIG. 5 is a schematic diagram illustrating an exemplary embodiment of a tunable RF front-end module. The tunable RF front-end module 500 comprises a first tunable filter 502 configured to receive a radio frequency input signal, RF_in, over connection 501. The RF_in signal on connection 501 can comprise a signal in any of the communication bands mentioned herein. The first tunable filter 502 is coupled to a low noise amplifier (LNA) 504 over connection 503. The LNA 504 is coupled to a second tunable filter 506 over connection 505. The output of the second tunable filter 506 is a radio frequency output signal, RF_out, and is provided over connection 507.

In an exemplary embodiment, at least some of the characteristics of the first tunable filter 502 may be different than at least some of the characteristics of the second tunable filter 506. For example, the first tunable filter 502 may be configured to provide a first portion of the overall desired signal rejection, while having a first insertion loss, and the second tunable filter 506 can be configured to provide a second portion of the overall desired signal rejection, while having a second insertion loss. The LNA 504 can be configured to amplify the band selective signal provided by the first tunable filter 502 to compensate for any insertion loss introduced by the first tunable filter 502 and the second tunable filter 506. The second tunable filter 506 provides a second band selective signal as an RF_out signal on connection 507. The signal rejection provided by the first tunable filter 502 may be greater than or less than the signal rejection provided by the second tunable filter 506. The insertion loss introduced by the first tunable filter 502 may be greater than or less than the insertion loss introduced by the second tunable filter 506. In an exemplary embodiment, the first tunable filter 502 and the second tunable filter 506 may be controlled by one or more control signals from the filter capacitance (C) control circuit 372 and the filter inductance (L) control circuit 374 of FIG. 3, or from another control device (not shown).

In an exemplary embodiment, any of the first tunable filter 502 and the second tunable filter 506 may also provide a bandpass filter mechanism for rejecting a signal that may occur at a frequency other than a frequency band of the desired receive signal. In an exemplary embodiment, the first tunable filter 502 may be designed to have a notch 511, or other filter characteristic, such as one or more bandpass filter characteristics, one or more trap characteristics, or other filter characteristics adapted to filter a signal occurring at a frequency other than the frequency band of the desired receive signal. In an exemplary embodiment, the first tunable filter 502 may include a notch 511, or other filter characteristic adapted to filter a signal occurring at a transmit frequency of the primary transceiver system 410 (FIG. 4) and which may be coupled from the primary antenna 411 (FIG. 4) to the dual feed antenna 421 (FIG. 4).

In an exemplary embodiment, the first tunable filter 502 may be configured to reject one or more blockers. For example, the first tunable filter 502 may be configured to reject a transmit blocker and a WiFi blocker, or the first tunable filter 502 may be configured to reject a transmit blocker and another OOB jammer. In an exemplary embodiment, the second tunable filter 506 can also reject one or more transmit blockers. In an exemplary embodiment, the capabilities of the first tunable filter 502 and the second tunable filter 506 may be interchanged.

In an exemplary embodiment, the first tunable filter 502 and the second tunable filter 506 can be implemented using an inductive-capacitive (LC) filter network and the LNA can be implemented using transistors fabricated according to one or more technologies, including, for example, field-effect-transistor (FET) technology. An exemplary process for fabricating the transistors and the capacitances is referred to as silicon on insulator (SOI) technology. The inductances in the LC network can be high-quality factor (high-Q) inductances which can be fabricated on the laminate structure on which the SOI chip can be assembled into a circuit package.

In an exemplary embodiment, the first tunable filter 502 and the second tunable filter 506 can be configured to provide the desired frequency selection, with sufficient blocker rejection, and an acceptable insertion loss, such that a receiver using the tunable RF front-end module 500 can be implemented without using a SAW filter for frequency selection and signal rejection, and without an associated matching network for each SAW filter.

Figure 6:
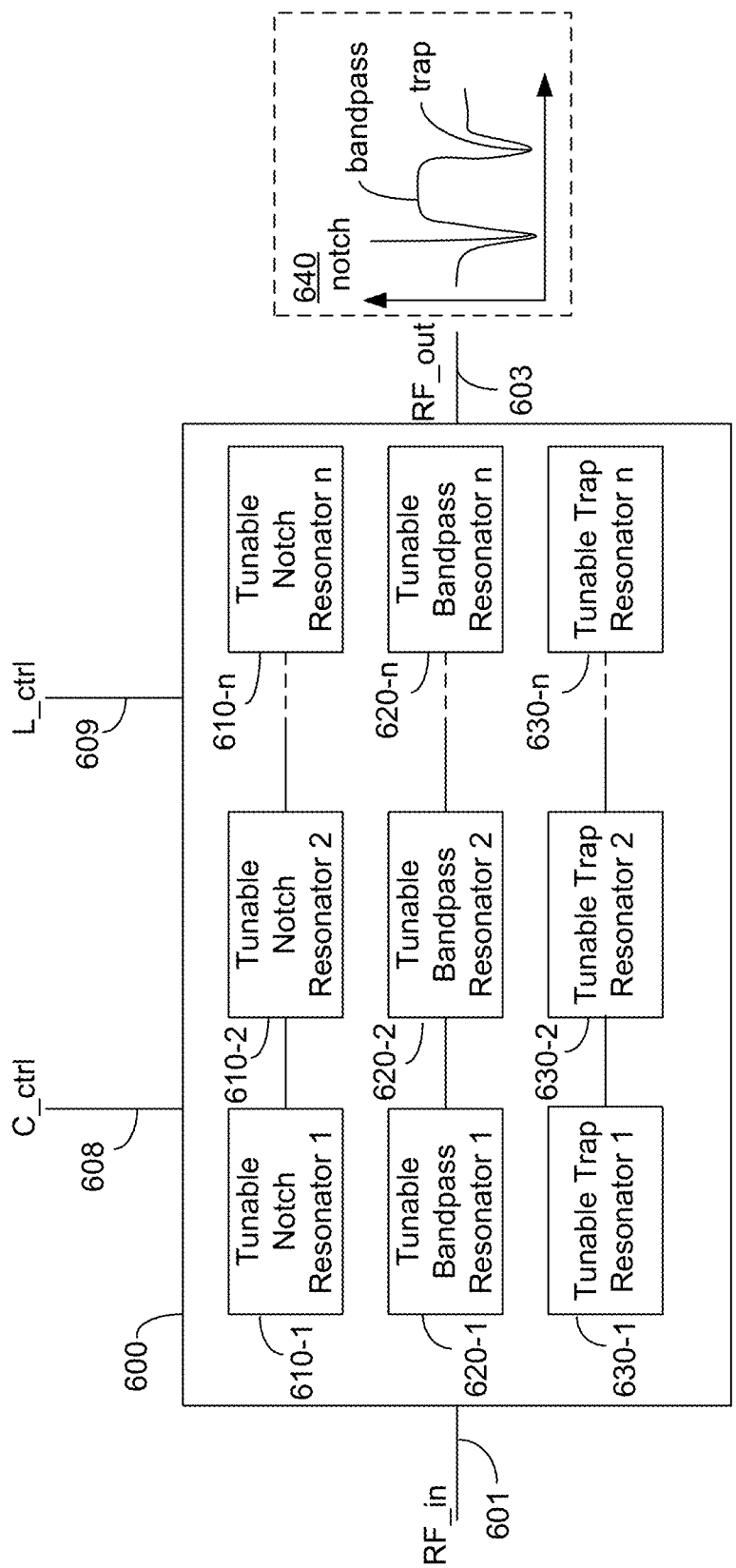
FIG. 6 is a block diagram illustrating an embodiment of a tunable filter.

FIG. 6 is a block diagram illustrating an embodiment of a tunable filter 600. The tunable filter 600 can be an exemplary embodiment of any of the tunable filters 502 and/or 506 described in FIG. 5. In an exemplary embodiment, the tunable filter 600 can be an exemplary implementation of the tunable filter 502 having a notch characteristic, a bandpass characteristic and a trap characteristic.

In an exemplary embodiment, the tunable filter 600 comprises one or more of a tunable notch resonator circuit 610, a tunable bandpass resonator circuit 620 and a tunable trap resonator circuit 630. For exemplary purposes only, there are three tunable notch resonator circuits 610-1, 610-2 and 610-$n$ shown in FIG. 6. Any integer number, n, of tunable notch resonator circuits 610 can be implemented in the tunable filter 600. Similarly, there are three tunable bandpass resonator circuits 620-1, 620-2 and 620-$n$, and three tunable trap resonator circuits 630-1, 630-2 and 630-$n$, shown in FIG. 6. Any integer number, n, of tunable bandpass resonator circuits 620 and tunable trap resonator circuits 630 can be implemented in the tunable filter 600 to create a multi-resonator coupled filter circuit. Moreover, fewer than all of a tunable notch resonator circuit 610, a tunable bandpass resonator circuit 620, and a tunable trap resonator circuit 630 can be implemented in the tunable filter 600. For example, any combination of a tunable notch resonator circuit 610, a tunable bandpass resonator circuit 620, and a tunable trap resonator circuit 630 can be implemented in the tunable filter 600. In exemplary embodiments, the tunable notch resonator circuit 610 can be configured to reject an RF signal by presenting a short circuit or an open circuit to the RF signal at a desired frequency. In an exemplary embodiment, the tunable trap resonator circuit 630 can be configured to reject an RF signal by presenting a short circuit to the RF signal at a desired frequency.

A radio frequency (RF) input signal is provided to the tunable filter 600 over connection 601 and a RF output signal is generated over connection 603. A first tuning input comprising a capacitance control signal, C_ctrl, is provided over connection 608. A second tuning input comprising an inductance control signal, L_ctrl, is provided over connection 609. The first control signal, C_ctrl, can be generated by the filter capacitance (C) control circuit 372 (FIG. 3), and the second control signal, L_ctrl, can be generated by the filter inductance (L) control circuit 374 of FIG. 3, to adjust any or all of the tunable notch resonator circuit 610, the tunable bandpass resonator circuit 620, and the tunable trap resonator circuit 630 to generate a frequency selective signal having any or all of a notch filter characteristic, a bandpass filter characteristic and/or a trap filter characteristic, as shown in the exemplary filter response curve 640.

FIG. 7A is a schematic diagram illustrating a first exemplary embodiment of a tunable notch resonator circuit. The tunable notch resonator circuit 700 comprises an adjustable capacitance 704, and inductances 706 and 708, which are coupled in series. The RF input signal, RF_in, is provided over connection 701 and the RF output signal, RF_out, is provided over connection 703. A switch 705 is coupled between the RF input signal on connection 701 and the node 709 between the inductances 706 and 708. The node 709 forms a tap between the inductances 706 and 708.

The tunable notch resonator circuit 700 is an example of using a "series-coupled" switch 705 that is controlled by the control signal, L_ctrl, over connection 609 to determine the value of the inductance presented to the RF_in signal. The tunable capacitance 704 is controlled by the control signal, C_ctrl, over connection 608.

In the exemplary embodiment shown in FIG. 7A, when the switch 705 is open, the inductance presented to the input signal on connection 701 comprises the value of the inductances 706 and 708. However, when the switch 705 is closed, the inductance presented to the input signal on connection 701 comprises the value of the inductance 708 only. In this manner, the total inductance provided by the tunable notch resonator circuit 700 may be adjusted, thereby adjusting the resonant frequency of the tunable notch resonator circuit 700. In an embodiment, the values of the inductances 706 and 708 may be the same, or substantially similar, whereby the inductance at the node 709 represents substantially one half of the total inductance, and the inductances 706 and 708 would be referred to as "center tapped" when the switch 705 is closed. In alternative embodiments, the values of the inductances 706 and 708 may be different, whereby the inductance at the node 709 represents less than or more than one half of the total inductance, and the inductances 706 and 708 would be referred to as "non-center tapped" when the switch 705 is closed. In any exemplary embodiments, the values of the inductances 706 and 708 and the value of the tunable capacitance 704 may be selected from a range of values configured to determine the resonant frequency of the tunable notch resonator circuit 700 both with the switch 705 open and the switch 705 closed. In this manner, the transmission zero of the tunable notch resonator circuit 700 can be adjusted.

FIG. 7B is a schematic diagram illustrating a second exemplary embodiment of a tunable notch resonator circuit. The tunable notch resonator circuit 720 comprises an adjustable capacitance 724, and inductances 726 and 728, which are coupled in parallel. The RF input signal, RF_in, is provided over connection 701 and the RF output signal, RF_out, is provided over connection 703. A switch 725 is coupled to one side of the inductance 726. The other side of the switch 725 is coupled to the input signal on connection 701.

The tunable notch resonator circuit 720 is an example of using a "parallel-coupled" switch 725 that is controlled by the control signal, L_ctrl, over connection 609 to determine the value of the inductance presented to the RF_in signal. The tunable capacitance 724 is controlled by the control signal, C_ctrl, over connection 608.

In the exemplary embodiment shown in FIG. 7B, when the switch 725 is open, the inductance presented to the input signal on connection 701 comprises the value of the inductance 728 alone. However, when the switch 725 is closed, the inductance presented to the input signal on connection 701 comprises the value of the inductance 728 and the value of the inductance 726. In this manner, the total inductance provided by the tunable notch resonator circuit 720 may be adjusted, thereby adjusting the resonant frequency of the tunable notch resonator circuit 720. In an embodiment, the values of the inductances 726 and 728 may be the same, or substantially similar, whereby the inductance at the RF_in connection 701 with the switch 725 open may comprise substantially one half of the total inductance. In alternative embodiments, the values of the inductances 726 and 728 may be different, whereby the inductance with the switch 725 open may present less than or more than one half of the total inductance to the input connection 701. In any exemplary embodiment, the values of the inductances 726 and 728 and the value of the tunable capacitance 724 may be selected from a range of values configured to determine the resonant frequency of the tunable notch resonator circuit 720 both with the switch 725 open and the switch 725 closed. In this manner, the transmission zero of the tunable notch resonator circuit 720 can be adjusted.

Figure 8B:
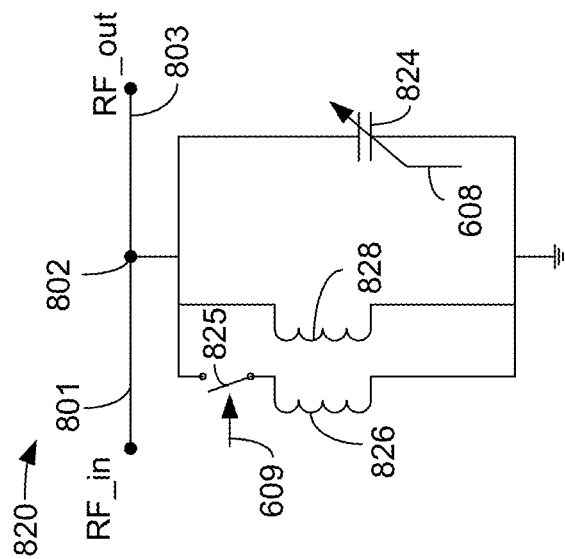
FIG. 8B is a schematic diagram illustrating a second exemplary embodiment of a tunable bandpass resonator circuit.
Figure 8A:
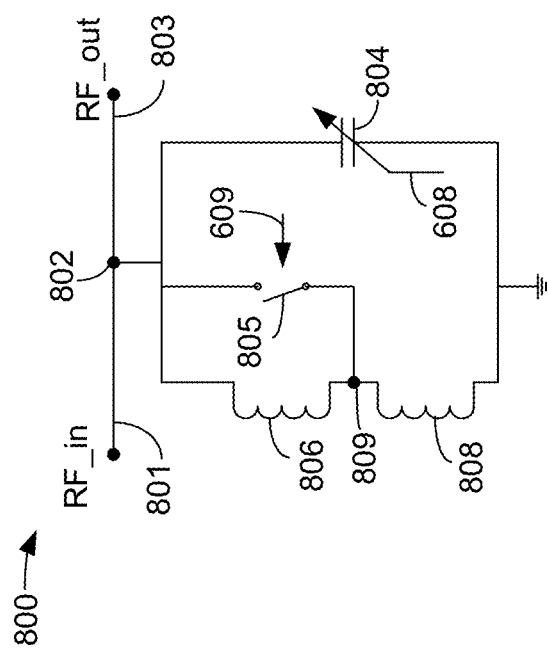
FIG. 8A is a schematic diagram illustrating a first exemplary embodiment of a tunable bandpass resonator circuit.

FIG. 8A is a schematic diagram illustrating a first exemplary embodiment of a tunable bandpass resonator circuit. The tunable bandpass resonator circuit 800 comprises an adjustable capacitance 804, and inductances 806 and 808, which are coupled in series. The RF input signal, RF_in, is provided over connection 801 and the RF output signal, RF_out, is provided over connection 803. A switch 805 is coupled between the node 802 between the input signal on connection 801 and the output signal on connection 803, and the node 809 between the inductances 806 and 808. The node 809 forms a tap between the inductances 806 and 808.

The tunable bandpass resonator circuit 800 is an example of using a "series-coupled" switch 805 that is controlled by the control signal, L_ctrl, over connection 609 to determine the value of the inductance presented to the RF_in signal. The tunable capacitance 804 is controlled by the control signal, C_ctrl, over connection 608.

In the exemplary embodiment shown in FIG. 8A, when the switch 805 is open, the inductance presented to the input signal on node 802 comprises the value of the inductances 806 and 808. However, when the switch 805 is closed, the inductance presented to the input signal on the node 802 comprises the value of the inductance 808 only. In this manner, the total inductance provided by the tunable bandpass resonator circuit 800 may be adjusted, thereby adjusting the resonant frequency of the tunable notch bandpass circuit 800. In an embodiment, the values of the inductances 806 and 808 may be the same, or substantially similar, whereby the inductance at the node 809 represents substantially one half of the total inductance, and the inductances 806 and 808 would be referred to as "center tapped" when the switch 805 is closed. In alternative embodiments, the values of the inductances 806 and 808 may be different, whereby the inductance at the node 809 represents less than or more than one half of the total inductance, and the inductances 806 and 808 would be referred to as "non-center tapped" when the switch 805 is closed. In any embodiment, the values of the inductances 806 and 808 and the value of the tunable capacitance 804 may be selected from a range of values configured to determine the resonant frequency of the tunable bandpass resonator circuit 800 both with the switch 805 open and the switch 805 closed. In this manner, the transmission pole of the tunable bandpass resonator circuit 800 can be adjusted.

FIG. 8B is a schematic diagram illustrating a second exemplary embodiment of a tunable bandpass resonator circuit. The tunable bandpass resonator circuit 820 comprises an adjustable capacitance 824, and inductances 826 and 828, which are coupled in parallel. The RF input signal, RF_in, is provided over connection 801 and the RF output signal, RF_out, is provided over connection 803. A switch 825 is coupled to one side of the inductance 826. The other side of the switch 825 is coupled to the node 802 between the RF input signal on connection 801 and the RF output signal on connection 803.

The tunable bandpass resonator circuit 820 is an example of using a "parallel-coupled" switch 825 that is controlled by the control signal, L_ctrl, over connection 609 to determine the value of the inductance presented to the signal at node 802. The tunable capacitance 824 is controlled by the control signal, C_ctrl, over connection 608.

In the exemplary embodiment shown in FIG. 8B, when the switch 825 is open, the inductance presented to the signal on node 802 comprises the value of the inductance 828 alone. However, when the switch 825 is closed, the inductance presented to the signal on node 802 comprises the value of the inductance 828 and the value of the inductance 826. In this manner, the total inductance provided by the tunable bandpass resonator circuit 820 may be adjusted, thereby adjusting the resonant frequency of the tunable bandpass resonator circuit 820. In an exemplary embodiment, the values of the inductances 826 and 828 may be the same, or substantially similar, whereby the inductance at the node 802 with the switch 825 open may comprise substantially one half of the total inductance. In alternative exemplary embodiments, the values of the inductances 826 and 828 may be different, whereby the inductance with the switch 825 open may present less than or more than one half of the total inductance to the signal on node 802. In any embodiment, the values of the inductances 826 and 828 and the value of the tunable capacitance 824 may be selected from a range of values configured to determine the resonant frequency of the tunable bandpass resonator circuit 820 both with the switch 825 open and the switch 825 closed. In this manner, the transmission pole of the tunable bandpass resonator circuit 820 can be adjusted.

FIG. 9A is a schematic diagram illustrating a first exemplary embodiment of a tunable trap resonator circuit. The tunable trap resonator circuit 900 comprises an adjustable capacitance 904, and inductances 906 and 908, which are coupled in series. The RF input signal, RF_in, is provided over connection 901 and the RF output signal, RF_out, is provided over connection 903. A switch 905 is coupled to the node 902 between the RF input signal on connection 701 and the RF output signal on connection 903, and the node 909 between the inductances 906 and 908. The node 909 forms a tap between the inductances 906 and 908.

The tunable trap resonator circuit 900 is an example of using a "series-coupled" switch 905 that is controlled by the control signal, L_ctrl, over connection 609 to determine the value of the inductance presented to the signal at node 902. The tunable capacitance 904 is controlled by the control signal, C_ctrl, over connection 608.

In the exemplary embodiment shown in FIG. 9A, when the switch 905 is open, the inductance presented to the signal on node 902 comprises the value of the inductances 906 and 908. However, when the switch 905 is closed, the inductance presented to the signal on node 902 comprises the value of the inductance 908 only. In this manner, the total inductance provided by the tunable trap resonator circuit 900 may be adjusted, thereby adjusting the resonant frequency of the tunable trap resonator circuit 900. In an embodiment, the values of the inductances 906 and 908 may be the same, or substantially similar, whereby the inductance at the node 909 represents substantially one half of the total inductance, and the inductances 906 and 908 would be referred to as "center tapped" when the switch 905 is closed. In alternative embodiments, the values of the inductances 906 and 908 may be different, whereby the inductance at the node 909 represents less than or more than one half of the total inductance, and the inductances 906 and 908 would be referred to as "non-center tapped" when the switch 905 is closed. In an exemplary embodiment, the values of the inductances 906 and 908 and the value of the tunable capacitance 904 may be selected from a range of values configured to determine the resonant frequency of the tunable trap resonator circuit 900 both with the switch 905 open and the switch 905 closed. In this manner, the transmission zero of the tunable trap resonator circuit 900 can be adjusted.

FIG. 9B is a schematic diagram illustrating a second exemplary embodiment of a tunable trap resonator circuit. The tunable trap resonator circuit 920 comprises an adjustable capacitance 924, and inductances 926 and 928, which are coupled in parallel. The RF input signal, RF_in, is provided over connection 901 and the RF output signal, RF_out, is provided over connection 903. A switch 925 is coupled to one side of the inductance 926. The other side of the switch 925 is coupled to the node 902 between the RF input signal on connection 901 and the RF output signal on connection 903.

The tunable trap resonator circuit 920 is an example of using a "parallel-coupled" switch 925 that is controlled by the control signal, L_ctrl, over connection 609 to determine the value of the inductance presented to the signal at node 902. The tunable capacitance 924 is controlled by the control signal, C_ctrl, over connection 608.

In the exemplary embodiment shown in FIG. 9B, when the switch 925 is open, the inductance presented to the signal on node 902 comprises the value of the inductance 928 alone.

However, when the switch 925 is closed, the inductance presented to the signal on node 902 comprises the value of the inductance 928 and the value of the inductance 926. In this manner, the total inductance provided by the tunable trap resonator circuit 920 may be adjusted, thereby adjusting the resonant frequency of the tunable trap resonator circuit 920. In an exemplary embodiment, the values of the inductances 926 and 928 may be the same, or substantially similar, whereby the inductance at the node 902 with the switch 925 open may comprise substantially one half of the total inductance. In alternative exemplary embodiments, the values of the inductances 926 and 928 may be different, whereby the inductance with the switch 925 open may present less than or more than one half of the total inductance to the signal on node 902. In an exemplary embodiment, the values of the inductances 926 and 928 and the value of the tunable capacitance 924 may be selected from a range of values configured to determine the resonant frequency of the tunable trap resonator circuit 920 both with the switch 925 open and the switch 925 closed. In this manner, the transmission zero of the tunable trap resonator circuit 920 can be adjusted.

In all of the exemplary embodiments shown in FIGS. 7A, 7B, 8A, 8B, 9A and 9B, when the switch is OFF, the off capacitance, $C_{off}$ of the switch will pull the response of the resonator slightly lower in frequency than that of a resonator without the switch. When the switch is turned ON, the small on resistance, $R_{on}$ will make the overall inductance smaller and the frequency response will increase, thereby extending the tuning range.

Figure 10:
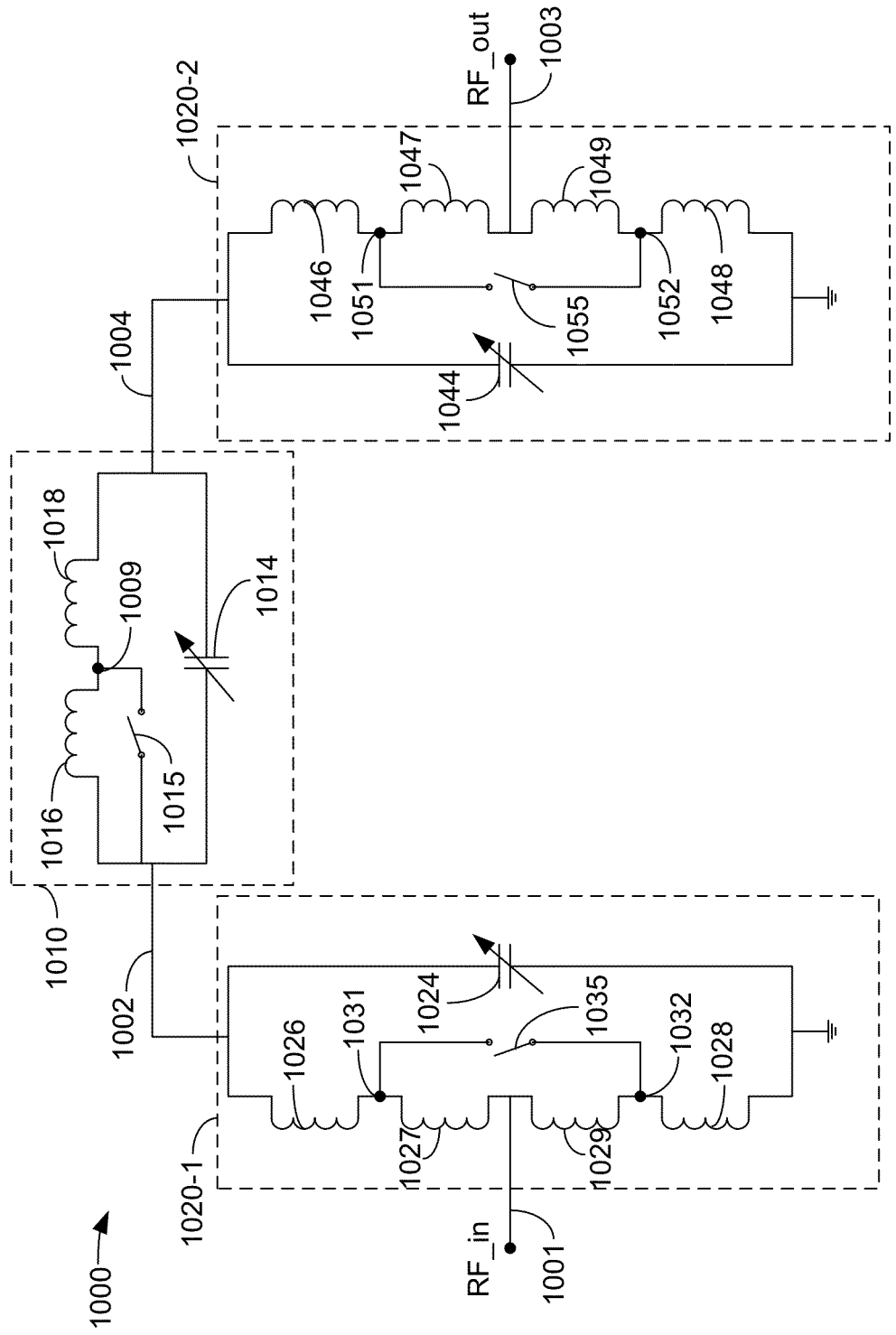
FIG. 10 is a schematic diagram illustrating an exemplary embodiment of a tunable filter structure comprising a bandpass filter structure and a notch filter structure.

FIG. 10 is a schematic diagram illustrating an exemplary embodiment of a tunable filter structure comprising a bandpass filter structure and a notch filter structure.

The filter structure 1000 comprises a tunable notch resonator circuit 1010, a first tunable bandpass resonator circuit 1020-1 and a second tunable bandpass resonator circuit 1020-2. In an exemplary embodiment, multiple iterations of a bandpass resonator circuit, such as the first tunable bandpass resonator circuit 1020-1 and a second tunable bandpass resonator circuit 1020-2 can be implemented to provide a sharp filter response. The number of bandpass resonator circuits determines the order of filter frequency transfer function.

The tunable notch resonator circuit 1010 comprises a tunable capacitance 1014, inductances 1016 and 1018 and a switch 1015. The switch 1015 is coupled between the node 1009 and the connection 1002. When turned off, the switch 1015 causes the inductance between the connection 1002 and the connection 1004 to comprise the total of the inductances 1016 and 1018. When turned on, the switch 1015 causes the inductance between the connection 1002 and the connection 1004 to comprise the total of the inductance 1018.

The first tunable bandpass resonator circuit 1020-1 comprises a tunable capacitance 1024, inductances 1026, 1027, 1028 and 1029, and a switch 1035. The switch 1035 is coupled between the node 1031 and the node 1032. When turned off, the switch 1035 causes the inductance between the connection 1002 and ground to comprise the total of the inductances 1026, 1027, 1028 and 1029. The RF input impedance match is determined by the total of the inductances 1026 and 1027, and the total of the inductances 1028 and 1029. When turned on, the switch 1035 causes the inductance between the connection 1002 and ground to comprise the total of the inductances 1026 and 1028 such that the RF input source is in series with the parallel combination of the inductances 1027 and 1029. RF input impedance matching is determined by the inductances 1026, 1028 and the parallel combination of the inductances 1027 and 1029. For example, the selection of the values of the inductances 1026, 1027, 1028, and 1029 determine the effective inductance of the first tunable bandpass resonator circuit 1020-1 with the switch 1035 in the ON state, the effective inductance of the first tunable bandpass resonator circuit 1020-1 with the switch 1035 in the OFF state, the RF input impedance matching provided by the first tunable bandpass resonator circuit 1020-1 with the switch 1035 in the ON state, and the RF input impedance matching of the first tunable bandpass resonator circuit 1020-1 with the switch 1035 in the OFF state. An RF input signal is provided over connection 1001.

The second tunable bandpass resonator circuit 1020-2 comprises a tunable capacitance 1044, inductances 1046, 1047, 1048 and 1049, and a switch 1055. The switch 1055 is coupled between the node 1051 and the node 1052. When turned off, the switch 1055 causes the inductance between the connection 1004 and ground to comprise the total of the inductances 1046, 1047, 1048 and 1049. The RF output impedance matching is determined by the total of the inductances 1046 and 1047, and the total of the inductances 1048 and 1049. When turned on, the switch 1055 causes the inductance between the connection 1004 and ground to comprise the total of the inductances 1046 and 1048, such that the RF output load is in series with the parallel combination of the inductances 1047 and 1049. An RF output signal is provided over connection 1003.

RF output impedance matching is determined by the inductances 1046, 1048 and the parallel combination of the inductances 1047 and 1049. For example, the selection of the values of the inductances 1046, 1047, 1048, and 1049 determines the effective inductance of the second tunable bandpass resonator circuit 1020-2 with the switch 1055 in the ON state, the effective inductance of the second tunable bandpass resonator circuit 1020-2 with the switch 1055 in the OFF state, the RF output impedance matching provided by the second tunable bandpass resonator circuit 1020-2 with the switch 1055 in the ON state, and the RF output impedance matching of the second tunable bandpass resonator circuit 1020-2 with the switch 1055 in the OFF state.

The control signal C_ctrl that controls the tunable capacitances 1014, 1024 and 1044, and the control signal L_ctrl that controls the switches 1015, 1035 and 1055 are omitted from the drawing for simplicity of illustration.

The filter structure 1000 illustrates the use of a tunable filter structure comprising tunable capacitance and switchable inductances to form a tunable resonator for notch and transmission bandpass filter poles in a two pole, one zero configuration. In an exemplary embodiment, the transmit frequency can range from approximately 1.8 to 2.8 GHz and the receive frequency can range from approximately 1.9 to 3 GHz. In an exemplary embodiment, the off capacitance of the switches 1015, 1035 and 1055 can be $C_{off}$=2 pF and an on resistance of the switches 1015, 1035 and 1055 can be $R_{on}$=0.08Ω and 40% of the total inductance value can be switched. In an exemplary embodiment, the values of the inductances 1026 and 1046 can be 0.78 nH, the values of the inductances 1027 and 1047 can be 0.62 nH, the value of the inductances 1029 and 1049 can be 0.42 nH, the value of the inductances 1028 and 1048 can be 0.78 nH, the value of the inductance 1016 can be 1.12 nH, and the value of the inductance 1018 can be 1.68 nH. The values of the capacitances 1024 and 1044 can range from 1.64 pF to 2.3 pF, and the value of the capacitance 1014 can range from 1.92 pF to 2.76 pf. In an exemplary embodiment, the capacitances 1014, 1024 and 1044 can each be implemented using a digital variable capacitance (DVC).

The tuning ratio (Con/Coff) of the DVC should cover the tolerance of the capacitances (20%) and inductances (20%). A lower tuning ratio (Con/Coff) leads to a higher DVC Q.

The following tables show the corresponding DVC Q by Con/Coff for the filter tuning range with and without the switchable inductances. In an exemplary embodiment, Table 1 and Table 2 show that the DVC Q of the capacitance 1014 can be improved from approximately 68 to approximately 105 by implementing the switch 1015 and the DVC Q of the capacitances 1024 and 1044 can be improved from approximately 68 to approximately 107 by implementing the switches 1035 and 1055.

TABLE 1

With switched inductances

|  | 1024/ 1044 | 1014 |
|---|---|---|
| Max (Ideal Con) | 2.3 pF | 2.76 pF |
| Min (Ideal Coff) | 1.64 pF | 1.92 pF |
| Max/Min | 1.4 | 1.44 |
| Con/Coff (Max/Min * 1.2 * 1.2) | 2 | 2.1 |
| DVC Q | 107 | 105 |

TABLE 2

Without switched inductances

|  | 1024/ 1044 | 1014 |
|---|---|---|
| Max (Ideal Con) | 2.67 pF | 3.13 pF |
| Min (Ideal Coff) | 1 pF | 1.15 pF |
| Max/Min | 2.67 | 2.71 |
| Con/Coff (Max/Min * 1.2 * 1.2) | 3.8 | 3.9 |
| DVC Q | 68 | 68 |

Figure 11:
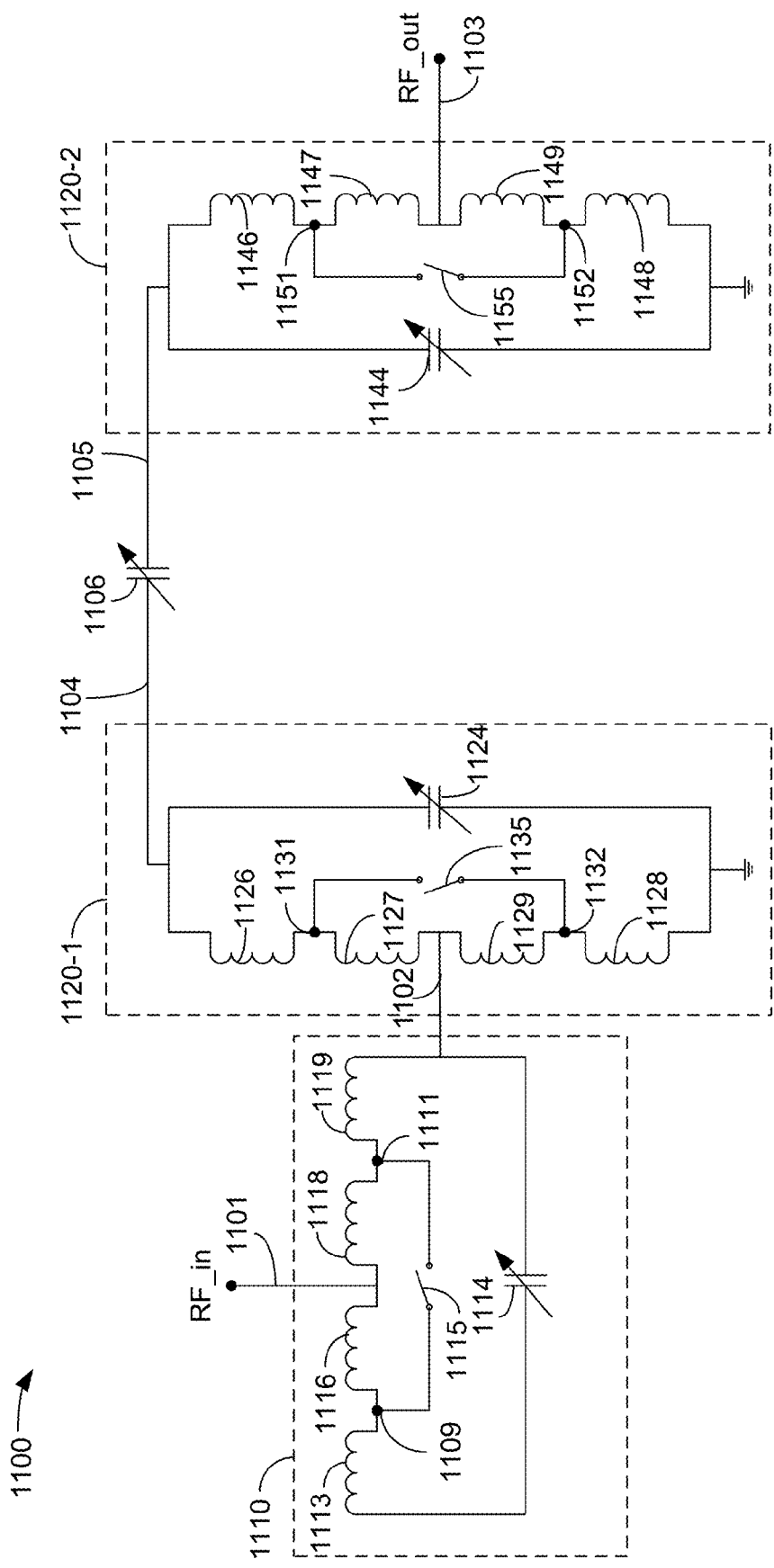
FIG. 11 is a schematic diagram illustrating an exemplary alternative embodiment of a tunable filter structure comprising a bandpass filter structure and a notch filter structure.

FIG. 11 is a schematic diagram illustrating an exemplary alternative embodiment of a tunable filter structure comprising a bandpass filter structure and a notch filter structure.

The filter structure 1100 comprises a tunable notch resonator circuit 1110, a first tunable bandpass resonator circuit 1120-1 and a second tunable bandpass resonator circuit 1120-2.

The tunable notch resonator circuit 1110 comprises a tunable capacitance 1114, inductances 1113, 1116, 1118 and 1119 and a switch 1115. The switch 1115 is coupled between the node 1109 and the node 1111. An RF input signal is provided over connection 1101. When turned off, the switch 1115 causes the inductance between the connection 1101 and the connection 1102 to comprise the total of the inductances 1113, 1116, 1118 and 1119. When turned on, the switch 1115 causes the inductance between the connection 1101 and the connection 1102 to comprise the total of the inductances 1113 and 1119, such that the RF input signal is in series with the parallel combination of the inductances 1116 and 1118.

The first tunable bandpass resonator circuit 1120-1 comprises a tunable capacitance 1124, inductances 1126, 1127, 1128 and 1129, and a switch 1135. The switch 1135 is coupled between the node 1131 and the node 1132. When turned off, the switch 1135 causes the inductance between the connection 1104 and ground to comprise the total of the inductances 1126, 1127, 1128 and 1129. The RF input impedance match is determined by the total of the inductances 1126 and 1127, and the total of the inductances 1128 and 1129. When turned on, the switch 1135 causes the inductance between the connection 1104 and ground to comprise the total of the inductances 1126 and 1128 such that the signal on connection 1102 is in series with the parallel combination of the inductances 1127 and 1129. An RF input signal is provided over connection 1101. RF input impedance matching is determined by the inductances 1126, 1128 and the parallel combination of the inductances 1127 and 1129. For example, the selection of the values of the inductances 1126, 1127, 1128, and 1129 determines the effective inductance of the first tunable bandpass resonator circuit 1120-1 with the switch 1135 in the ON state, the effective inductance of the first tunable bandpass resonator circuit 1120-1 with the switch 1135 in the OFF state, the RF input impedance matching provided by the first tunable bandpass resonator circuit 1120-1 with the switch 1135 in the ON state, and the RF input impedance matching of the first tunable bandpass resonator circuit 1120-1 with the switch 1135 in the OFF state.

The second tunable bandpass resonator circuit 1120-2 comprises a tunable capacitance 1144, inductances 1146, 1147, 1148 and 1149, and a switch 1155. The switch 1155 is coupled between the node 1151 and the node 1152. When turned off, the switch 1155 causes the inductance between the connection 1105 and ground to comprise the total of the inductances 1146, 1147, 1148 and 1149. The RF output impedance match is determined by the total of the inductances 1146 and 1147, and the total of the inductances 1148 and 1149. When turned on, the switch 1155 causes the inductance between the connection 1105 and ground to comprise the total of the inductances 1146 and 1148 such that the RF output load is in series with the parallel combination of the inductances 1147 and 1149. An RF output signal is provided over connection 1103. An adjustable capacitance 1106 is coupled between the connection 1104 and the connection 1105. RF output impedance matching is determined by the inductances 1146, 1148 and the parallel combination of the inductances 1147 and 1149. For example, the selection of the values of the inductances 1146, 1147, 1148, and 1149 determines the effective inductance of the second tunable bandpass resonator circuit 1120-2 with the switch 1155 in the ON state, the effective inductance of the second tunable bandpass resonator circuit 1120-2 with the switch 1155 in the OFF state, the RF output impedance matching provided by the second tunable bandpass resonator circuit 1120-2 with the switch 1155 in the ON state, and the RF output matching of the second tunable bandpass resonator circuit 1120-2 with the switch 1155 in the OFF state.

The control signal C_ctrl that controls the tunable capacitances 1106, 1114, 1124 and 1144, and the control signal L_ctrl that controls the switches 1115, 1135 and 1155 are omitted from the drawing for simplicity of illustration.

The filter structure 1100 illustrates the use of a tunable filter structure comprising tunable capacitance and switchable inductances to form a tunable resonator for notch and transmission bandpass filter poles, in a two pole, one zero configuration.

In an exemplary embodiment, the off capacitance of the switches 1115, 1135 and 1155 can be $C_{off}=2$ pF and an on resistance of the switches 1115, 1135 and 1155 can be $R_{on}=0.08\Omega$ and 40% of the total inductance value can be switched.

In an exemplary embodiment, the value of the inductance 1113 can be 0.4 nH, the value of the inductance 1116 can be 0.48 nH, the value of the inductance 1118 can be 0.32 nH, the value of the inductance 1119 can be 0.6 nH, the value of the inductance 1126 can be 0.8 nH, the value of the inductances 1127 and 1147 can be 0.4 nH, the value of the inductances 1129 and 1149 can be 0.6 nH, the value of the inductance 1128 can be 0.7 nH, the value of the inductance 1146 can be 1 nH, and the value of the inductance 1148 can be 0.5 nH.

In an exemplary embodiment, the value of the capacitance 1114 may range between approximately 3.2-3.9 pF, the value of the capacitance 1124 may range between approximately 1.5-1.9 pF, the value of the capacitance 1106 may range between approximately 0.2-0.25 pF, and the value of the capacitance 1144 may range between approximately 1.6-2.1 pF. In an exemplary embodiment, the capacitances 1114, 1124 1106 and 1144 can each be implemented using a digital variable capacitance (DVC), as described above.

Figure 12:
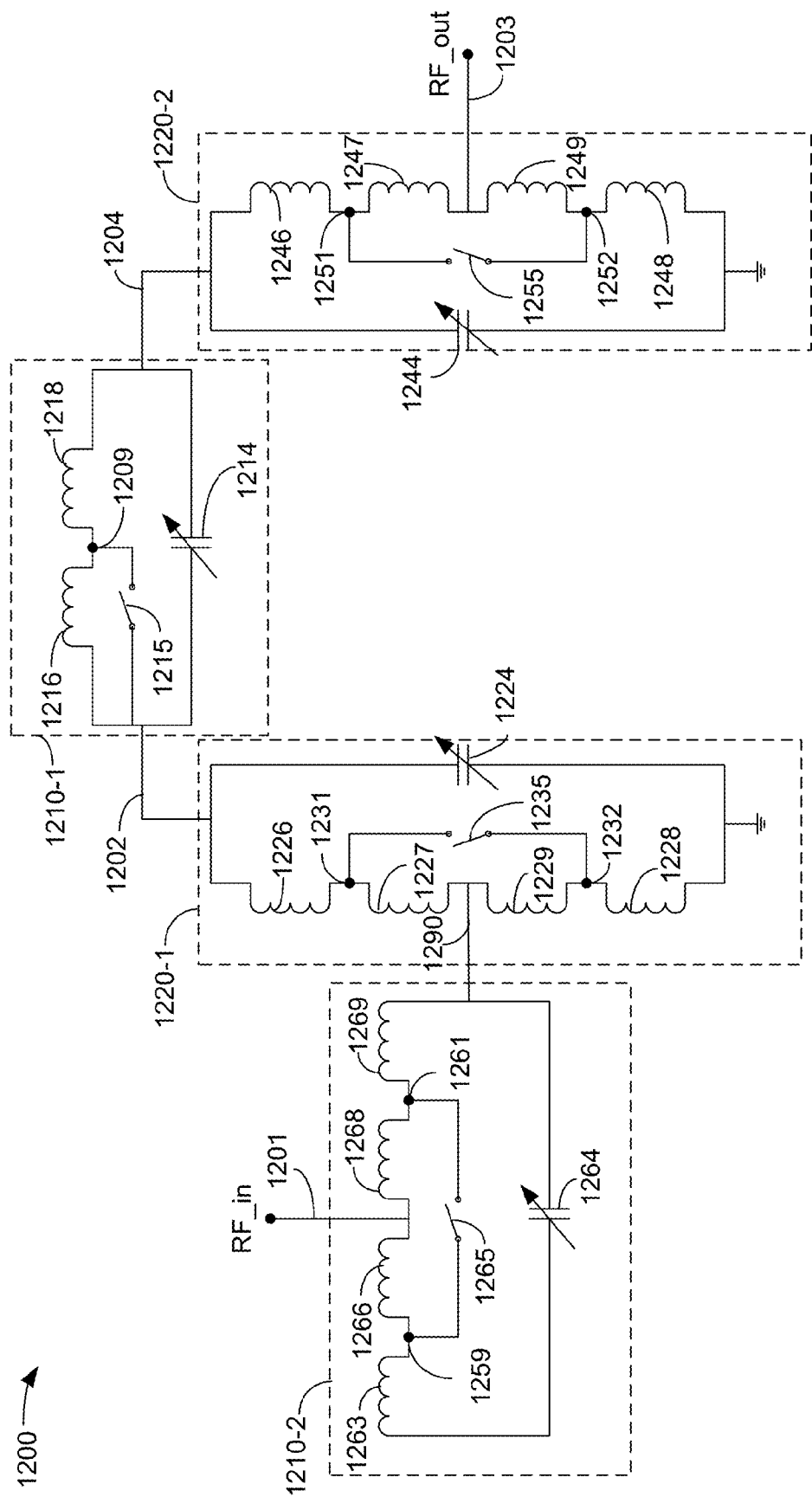
FIG. 12 is a schematic diagram illustrating another exemplary alternative embodiment of a tunable filter structure comprising a bandpass filter structure and a notch filter structure.

FIG. 12 is a schematic diagram illustrating another exemplary alternative embodiment of a tunable filter structure comprising a bandpass filter structure and a notch filter structure.

The filter structure 1200 comprises a first tunable notch resonator circuit 1210-1, a second tunable notch resonator circuit 1210-2, a first tunable bandpass resonator circuit 1220-1 and a second tunable bandpass resonator circuit 1220-2.

The first tunable notch resonator circuit 1210-1 comprises a tunable capacitance 1214, inductances 1216 and 1218 and a switch 1215. The switch 1215 is coupled between the node 1209 and the connection 1202. When turned off, the switch 1215 causes the inductance between the connection 1202 and the connection 1204 to comprise the total of the inductances 1216 and 1218. When turned on, the switch 1215 causes the inductance between the connection 1202 and the connection 1204 to comprise the total of the inductance 1218.

The second tunable notch resonator circuit 1210-2 comprises a tunable capacitance 1264, inductances 1263, 1266, 1268 and 1269, and a switch 1265. The switch 1265 is coupled between the node 1259 and the node 1261. An RF input signal is provided over connection 1201. When turned off, the switch 1265 causes the inductance between the connection 1201 and the connection 1290 to comprise the total of the inductances 1263, 1266, 1268 and 1269. When turned on, the switch 1265 causes the inductance between the connection 1201 and the connection 1290 to comprise the total of the inductances 1263 and 1269, such that the RF input signal is in series with the parallel combination of the inductances 1266 and 1268.

The first tunable bandpass resonator circuit 1220-1 comprises a tunable capacitance 1224, inductances 1226, 1227, 1228 and 1229, and a switch 1235. The switch 1235 is coupled between the node 1231 and the node 1232. When turned off, the switch 1235 causes the inductance between the connection 1202 and ground to comprise the total of the inductances 1226, 1227, 1228 and 1229. The RF input impedance matching is determined by the total of the inductances 1226 and 1227, and the total of the inductances 1228 and 1229. When turned on, the switch 1235 causes the inductance between the connection 1202 and ground to comprise the total of the inductances 1226 and 1228 such that the signal on connection 1290 is in series with the parallel combination of the inductances 1227 and 1229. RF input impedance matching is determined by the inductances 1226, 1228 and the parallel combination of the inductances 1227 and 1229. For example, the selection of the values of the inductances 1226, 1227, 1228, and 1229 determines the effective inductance of the first tunable bandpass resonator circuit 1220-1 with the switch 1235 in the ON state, the effective inductance of the first tunable bandpass resonator circuit 1220-1 with the switch 1235 in the OFF state, the RF input impedance matching provided by the first tunable bandpass resonator circuit 1220-1 with the switch 1235 in the ON state, and the RF input impedance matching of the first tunable bandpass resonator circuit 1220-1 with the switch 1235 in the OFF state.

The second tunable bandpass resonator circuit 1220-2 comprises a tunable capacitance 1244, inductances 1246, 1247, 1248 and 1249, and a switch 1255. The switch 1255 is coupled between the node 1251 and the node 1252. When turned off, the switch 1255 causes the inductance between the connection 1204 and ground to comprise the total of the inductances 1246, 1247, 1248 and 1249. The RF output impedance matching is determined by the total of the inductances 1246 and 1247, and the total of the inductances 1248 and 1249. When turned on, the switch 1255 causes the inductance between the connection 1204 and ground to comprise the total of the inductances 1246 and 1248 such that the RF output load is in series with the parallel combination of the inductances 1247 and 1249. An RF output signal is provided over connection 1203. RF output impedance matching is determined by the inductances 1246, 1248 and the parallel combination of the inductances 1247 and 1249. For example, the selection of the values of the inductances 1246, 1247, 1248, and 1249 determine the effective inductance of the second tunable bandpass resonator circuit 1220-2 with the switch 1255 in the ON state, the effective inductance of the second tunable bandpass resonator circuit 1220-2 with the switch 1255 in the OFF state, the RF output impedance matching provided by the second tunable bandpass resonator circuit 1220-2 with the switch 1255 in the ON state, and the RF output impedance matching of the second tunable bandpass resonator circuit 1220-2 with the switch 1255 in the OFF state.

The control signal C_ctrl that controls the tunable capacitances 1214, 1264, 1224 and 1244, and the control signal L_ctrl that controls the switches 1215, 1265, 1235 and 1255 are omitted from the drawing for simplicity of illustration.

The filter structure 1200 illustrates the use of a tunable filter structure comprising tunable capacitance and switchable inductances to form a tunable resonator for notch and transmission bandpass filter poles in a two pole, two zero configuration.

In an exemplary embodiment, the off capacitance of the switches 1265, 1215, 1235 and 1255 can be $C_{off}$=2 pF and an on resistance of the switches 1265, 1215, 1235 and 1255 can be $R_{on}$=0.08Ω and 40% of the total inductance value can be switched.

In an exemplary embodiment, the value of the inductance 1263 can be 0.58 nH, the value of the inductance 1266 can be 0.32 nH, the value of the inductance 1268 can be 0.48 nH, the value of the inductance 1269 can be 0.38 nH, the value of the inductances 1226 and 1246 can be 0.78 nH, the value of the inductances 1227 and 1247 can be 0.62 nH, the value of the inductances 1229 and 1249 can be 0.42 nH, the value of the inductances 1228 and 1248 can be 0.78 nH, the value of the inductance 1216 can be 1.2 nH, and the value of the inductance 1218 can be 1.68 nH.

In an exemplary embodiment, the value of the capacitance 1264 may range between approximately 3.3-4.0 pF, the value of the capacitance 1224 may range between approximately 1.64-2.1 pF, the value of the capacitance 1214 may range between approximately 1.92-2.4 pF, and the value of the capacitance 1244 may range between approximately 1.64-2.2 pF. In an exemplary embodiment, the capacitances 1264, 1224 1214 and 1244 can each be implemented using a digital variable capacitance (DVC), as described above.

Figure 13:
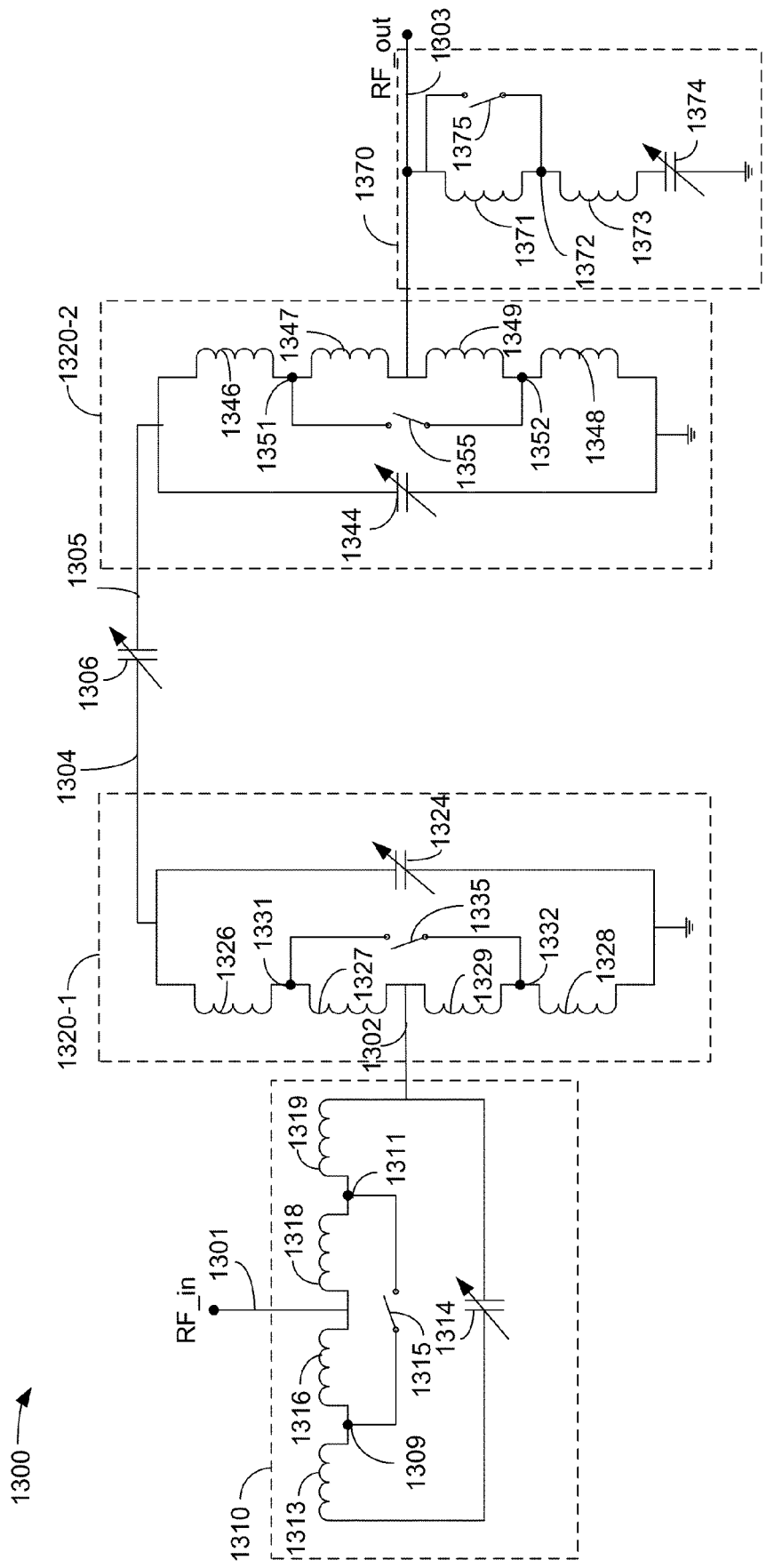
FIG. 13 is a schematic diagram illustrating an exemplary alternative embodiment of a tunable filter structure comprising a notch filter structure, a bandpass filter structure and a trap filter structure.

FIG. 13 is a schematic diagram illustrating an exemplary alternative embodiment of a tunable filter structure comprising a notch filter structure, a bandpass filter structure and a trap filter structure.

The filter structure 1300 comprises a tunable notch resonator circuit 1310, a first tunable bandpass resonator circuit 1320-1, a second tunable bandpass resonator circuit 1320-2 and a tunable trap resonator circuit 1370.

The tunable notch resonator circuit 1310 comprises a tunable capacitance 1314, inductances 1313, 1316, 1318 and 1319 and a switch 1315. The switch 1315 is coupled between the node 1309 and the node 1311. An RF input signal is provided over connection 1301. When turned off, the switch 1315 causes the inductance between the connection 1301 and the connection 1302 to comprise the total of the inductances 1313, 1316, 1318 and 1319. When turned on, the switch 1315 causes the inductance between the connection 1301 and the connection 1302 to comprise the total of the inductances 1313 and 1319, such that the RF input signal is in series with the parallel combination of the inductances 1316 and 1318.

The first tunable bandpass resonator circuit 1320-1 comprises a tunable capacitance 1324, inductances 1326, 1327, 1328 and 1329, and a switch 1335. The switch 1335 is coupled between the node 1331 and the node 1332. When turned off, the switch 1335 causes the inductance between the connection 1304 and ground to comprise the total of the inductances 1326, 1327, 1328 and 1329. The RF input impedance match is determined by the total of the inductances 1326 and 1327, and the total of the inductances 1328 and 1329. When turned on, the switch 1335 causes the inductance between the connection 1304 and ground to comprise the total of the inductances 1326 and 1328 such that the signal on connection 1302 is in series with the parallel combination of the inductances 1327 and 1329. An RF input signal is provided over connection 1301. RF input impedance matching is determined by the inductances 1326, 1328 and the parallel combination of the inductances 1327 and 1329. For example, the selection of the values of the inductances 1326, 1327, 1328, and 1329 determines the effective inductance of the first tunable bandpass resonator circuit 1320-1 with the switch 1335 in the ON state, the effective inductance of the first tunable bandpass resonator circuit 1320-1 with the switch 1335 in the OFF state, the RF input impedance matching provided by the first tunable bandpass resonator circuit 1320-1 with the switch 1335 in the ON state, and the RF input impedance matching of the first tunable bandpass resonator circuit 1320-1 with the switch 1335 in the OFF state.

The second tunable bandpass resonator circuit 1320-2 comprises a tunable capacitance 1344, inductances 1346, 1347, 1348 and 1349, and a switch 1355. The switch 1355 is coupled between the node 1351 and the node 1352. When turned off, the switch 1355 causes the inductance between the connection 1305 and ground to comprise the total of the inductances 1346, 1347, 1348 and 1349. The RF output impedance match is determined by the total of the inductances 1346 and 1347, and the total of the inductances 1348 and 1349. When turned on, the switch 1355 causes the inductance between the connection 1305 and ground to comprise the total of the inductances 1346 and 1348 such that the RF output load is in series with the parallel combination of the inductances 1347 and 1349. An RF output signal is provided over connection 1303. An adjustable capacitance 1306 is coupled between the connection 1304 and the connection 1305. RF output impedance matching is determined by the inductances 1346, 1348 and the parallel combination of the inductances 1347 and 1349. For example, the selection of the values of the inductances 1346, 1347, 1348, and 1349 determines the effective inductance of the second tunable bandpass resonator circuit 1320-2 with the switch 1355 in the ON state, the effective inductance of the second tunable bandpass resonator circuit 1320-2 with the switch 1355 in the OFF state, the RF output impedance matching provided by the second tunable bandpass resonator circuit 1320-2 with the switch 1355 in the ON state, and the RF output matching of the second tunable bandpass resonator circuit 1320-2 with the switch 1355 in the OFF state.

A tunable trap resonator 1370 comprises a tunable capacitance 1374, inductances 1371 and 1373, and a switch 1375. The switch 1375 is coupled between the RF output signal on connection 1303 and a node 1372 located between the inductance 1371 and the inductance 1373. When turned off, the switch 1375 causes the inductance between the connection 1303 and the tunable capacitance 1374 to comprise the total of the inductances 1371 and 1373. When turned on, the switch 1375 causes the inductance between the connection 1303 and the tunable capacitance 1374 to comprise the total of the inductance 1373, such that a trap filter characteristic is created at the RF output signal on connection 1303.

The control signal C_ctrl that controls the tunable capacitances 1306, 1314, 1324, 1344 and 1374, and the control signal L_ctrl that controls the switches 1315, 1335, 1355 and 1375 are omitted from the drawing for simplicity of illustration.

The filter structure 1300 illustrates the use of a tunable filter structure comprising tunable capacitance and switchable inductances to form a tunable resonator for notch, transmission bandpass filter poles, and a tunable resonator for trap poles, in a two pole, two zero configuration.

In an exemplary embodiment, the off capacitance of the switches 1315, 1335, 1355 and 1375 can be $C_{off}=2$ pF and an on resistance of the switches 1315, 1335, 1355 and 1375 can be $R_{on}=0.08\Omega$.

In an exemplary embodiment, the value of the inductance 1313 can be 0.4 nH, the value of the inductance 1316 can be 0.48 nH, the value of the inductance 1318 can be 0.32 nH, the value of the inductance 1319 can be 0.6 nH, the value of the inductance 1326 can be 0.8 nH, the value of the inductance 1327 can be 0.4 nH, the value of the inductance 1329 can be 0.6 nH, the value of the inductance 1328 can be 0.7 nH, the value of the inductance 1346 can be 0.75 nH, the value of the inductance 1347 can be 0.45 nH, the value of the inductance 1348 can be 1.0 nH, the value of the inductance 1349 can be 0.3 nH, the value of the inductance 1371 can be 1.14 nH and the value of the inductance 1373 can be 4.56 nH. In an exemplary embodiment, the value of the capacitance 1314 may range between approximately 3.2-3.9 pF, the value of the capacitance 1324 may range between approximately 1.5-1.9 pF, the value of the capacitance 1306 may range between approximately 0.2-0.25 pF, the value of the capacitance 1344 may range between approximately 1.9-3.0 pF, and the value of the capacitance 1374 may range between approximately 0.8-1.5 pF. In an exemplary embodiment, the capacitances 1314, 1324 1306, 1344 and 1374 can each be implemented using a digital variable capacitance (DVC), as described above.

Figure 14:
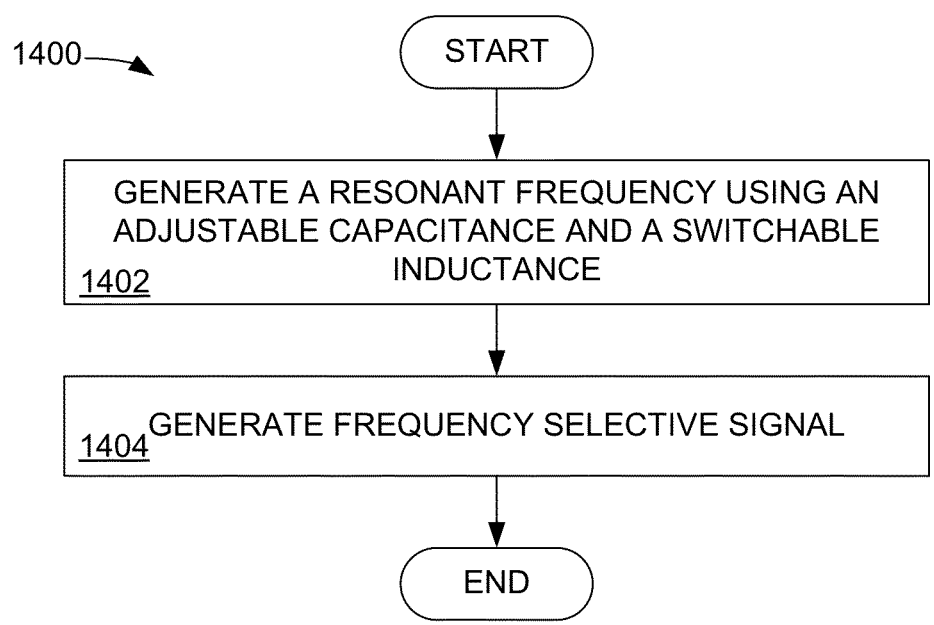
FIG. 14 is a flow chart describing an exemplary embodiment of a method for operating a tunable RF front-end architecture.

FIG. 14 is a flow chart describing an exemplary embodiment of a method for operating a tunable RF front-end architecture.

In block 1402, a resonant frequency is generated using an adjustable capacitance and a switchable inductance.

In block 1404, a frequency selective signal is generated.

The tunable RF front-end architecture described herein may be implemented on one or more ICs, analog ICs, RFICs, mixed-signal ICs, ASICs, printed circuit boards (PCBs), electronic devices, etc. The tunable RF front-end architecture may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the tunable RF front-end architecture described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

As used in this description, the terms "component," "database," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

What is claimed is:

1. A device, comprising:
   an adjustable capacitance;
   a switchable inductance coupled to the adjustable capacitance and configured as a tunable resonant filter circuit, the switchable inductance comprising a tapped structure having a first inductance and a second inductance;
   a low noise amplifier coupled to an output of the tunable resonant filter circuit, the low noise amplifier configured to generate a first amplified frequency selective signal; and
   a second tunable filter coupled to an output of the low noise amplifier, the second tunable filter configured to provide a second frequency selective signal.

2. The device of claim 1, further comprising a plurality of tunable resonant filter circuits.

3. The device of claim 1, wherein the tunable resonant filter circuit comprises a notch characteristic configured to reject a blocker signal at a transmit frequency.

4. The device of claim 1, wherein the tunable resonant filter circuit comprises one or more of a tunable notch resonator, a tunable bandpass resonator and a tunable trap resonator.

5. The device of claim 1, wherein the first inductance and the second inductance comprise different inductance values.

6. The device of claim 1, wherein at least one of the tunable resonant filter circuit and the second tunable filter comprises a notch characteristic.

7. The device of claim 1, wherein the tunable resonant filter circuit provides a first signal rejection and the second tunable filter provides a second signal rejection.

8. The device of claim 7, wherein, the first signal rejection is higher than the second signal rejection.

9. The device of claim 1, wherein the tunable resonant filter circuit introduces a first insertion loss and the second tunable filter introduces a second insertion loss.

10. The device of claim 9, wherein the first insertion loss is different than the second insertion loss.

11. A method, comprising:
    generating a resonant frequency using an adjustable capacitance and a switchable inductance configured as a tunable filter, the switchable inductance comprising a tapped structure having a first inductance and a second inductance;
    amplifying an output of the tunable filter to generate a first amplified frequency selective signal; and
    filtering the first amplified frequency selective signal to provide a second frequency selective signal.

12. The method of claim 11, further comprising generating a resonant frequency having a notch characteristic configured to reject a blocker signal at a transmit frequency.

13. The method of claim 11, further comprising generating a resonant frequency having a bandpass characteristic.

14. The method of claim 11, further comprising generating a resonant frequency having a trap characteristic.

15. A device, comprising:
    means for filtering, the means for filtering comprising means for generating a resonant frequency using an adjustable capacitance and a switchable inductance, the switchable inductance comprising a tapped structure having a first inductance and a second inductance;
    means for generating a first amplified frequency selective signal, the means for generating being coupled to an output of the means for filtering; and
    means for providing a second frequency selective signal, the means for providing being coupled to an output of the means for generating.

16. The device of claim 15, further comprising means for generating a resonant frequency having a notch characteristic configured to reject a blocker signal at a transmit frequency.

17. The device of claim 15, further comprising means for generating a resonant frequency having a bandpass characteristic.

18. The device of claim 15, further comprising means for generating a resonant frequency having a trap characteristic.

* * * * *